(12) United States Patent
Jiang et al.

(10) Patent No.: US 12,261,129 B2
(45) Date of Patent: Mar. 25, 2025

(54) DAMPING DEVICE AND METHOD OF MAKING

(71) Applicant: TAIWAN SEMICONDUCTOR MANUFACTURING COMPANY LIMITED, Hsin-Chu (TW)

(72) Inventors: Jheng-Hong Jiang, Hsinchu (TW); Shing-Huang Wu, Hsinchu (TW); Chia-Wei Liu, Zhubei (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 311 days.

(21) Appl. No.: 17/582,091

(22) Filed: Jan. 24, 2022

(65) Prior Publication Data

US 2023/0027657 A1  Jan. 26, 2023

Related U.S. Application Data

(60) Provisional application No. 63/225,429, filed on Jul. 23, 2021.

(51) Int. Cl.
*H01L 23/00* (2006.01)
*H01L 27/146* (2006.01)

(52) U.S. Cl.
CPC ...... *H01L 23/562* (2013.01); *H01L 27/14618* (2013.01)

(58) Field of Classification Search
None
See application file for complete search history.

(56) References Cited

U.S. PATENT DOCUMENTS

| | | | |
|---|---|---|---|
| 10,942,329 B1* | 3/2021 | Lee | G03F 9/7096 |
| 11,393,773 B1* | 7/2022 | Bui | H01L 23/562 |
| 2013/0277777 A1* | 10/2013 | Chang | B81C 1/00 438/51 |
| 2019/0049630 A1* | 2/2019 | Chuang | B32B 27/365 |
| 2021/0188627 A1* | 6/2021 | Chu | B81C 1/00277 |

* cited by examiner

*Primary Examiner* — Bo B Jang
(74) *Attorney, Agent, or Firm* — Cooper Legal Group, LLC

(57) ABSTRACT

A damping device is provided. The damping device includes a damper including a mechanical deflector. The damping device includes a post coupled to the mechanical deflector. The damping device includes a case in which the damper is disposed.

20 Claims, 23 Drawing Sheets

DAMPING DEVICE AND METHOD OF MAKING

RELATED APPLICATION

This application claims the benefit of U.S. Provisional Application No. 63/225,429 filed Jul. 23, 2021, which is incorporated herein by reference in its entirety.

BACKGROUND

Semiconductor devices are used in a multitude of electronic devices, such as mobile phones, laptops, desktops, tablets, watches, gaming systems, and various other industrial, commercial, and consumer electronics. Semiconductor devices generally comprise semiconductor portions and wiring portions formed inside the semiconductor portions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
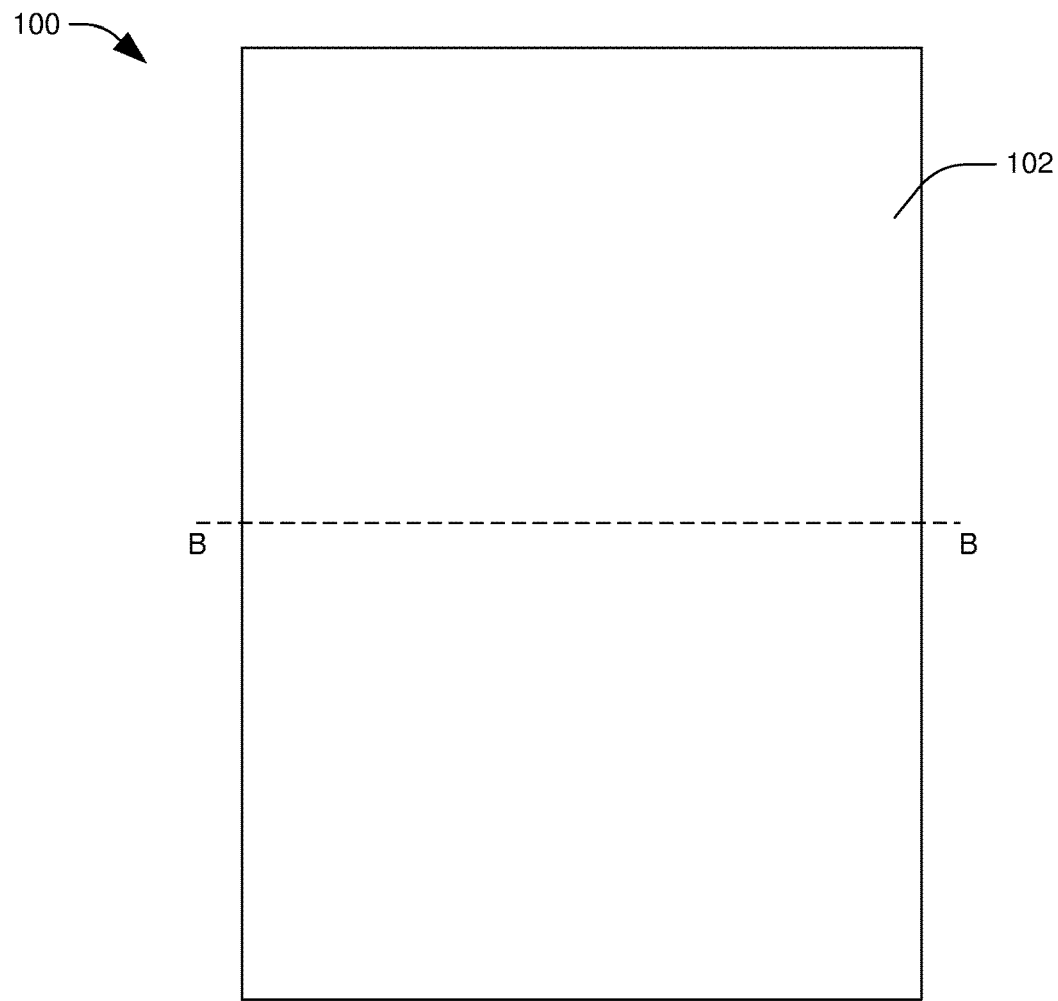
FIGS. 1A-1B illustrate a semiconductor device at a stage of fabrication, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

A semiconductor device has a damping device and a chip holder configured to support a chip. The damping device includes a damper, a case in which the damper is disposed, and a post. A first end of the post is coupled to the damper and a second end of the post is coupled to the chip holder. Force of at least one of vibrations, movements, shock impulses, etc. to which the semiconductor device is subjected is transferred through the post to the damper, where the force is at least one of damped or absorbed by way of at least one of deformation, deflection, etc. of the damper. The damping device thereby reduces stress on at least one of the chip holder or the chip. Further, implementing the semiconductor device with the damping device inhibits and/or prevents damage to the semiconductor device and/or the chip, and improves a mechanical stability of the semiconductor device and/or the chip, where the improved mechanical stability provides for, among other things, improved performance, reliability, longevity, etc. of the semiconductor device and/or the chip.

Figure 16:
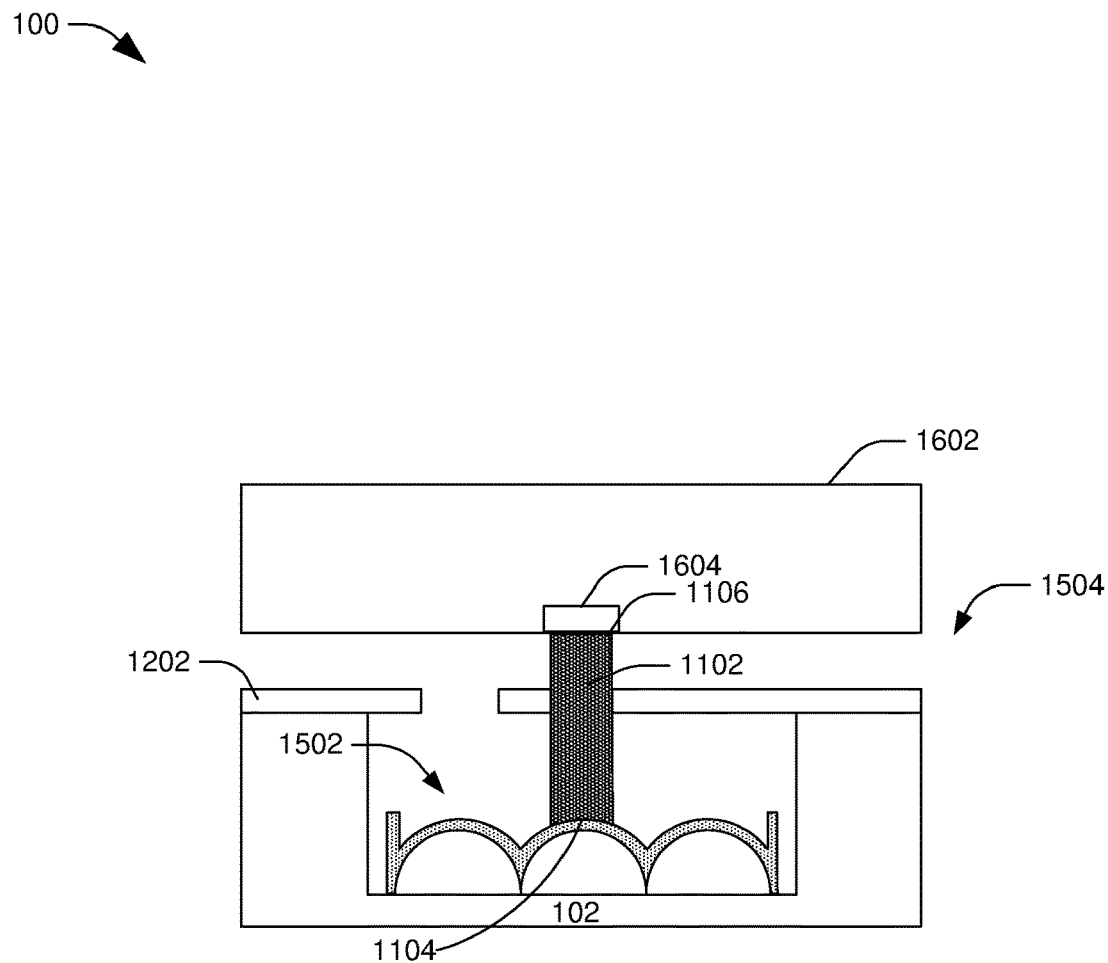
FIG. 16 illustrates a semiconductor device at a stage of fabrication, in accordance with some embodiments.
Figure 17:
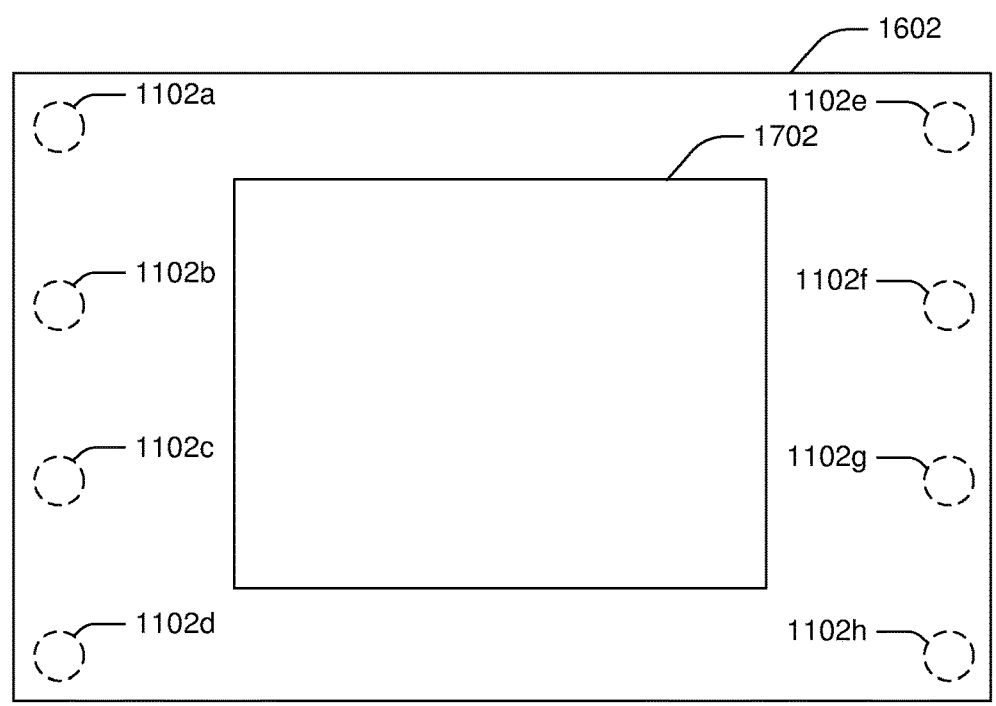
FIG. 17 illustrates a semiconductor device at a stage of fabrication, in accordance with some embodiments.

FIGS. 1A-17 illustrate a semiconductor device 100 at various stages of fabrication, in accordance with some embodiments. FIGS. 1A, 2A, 3A, 4A, 5A, 6A, 7A, 8A, 9A, 10A, 11A, 12A, 13A, 14A, and 15A illustrate top views of the semiconductor device 100 at various stages of fabrication. FIGS. 1B, 2B, 3B, 4B, 5B, 6B, 7B, 8B, 9B, 10B, 11B, 12B, 13B, 14B, and 15B illustrate cross-sectional views of the semiconductor device 100 taken along lines B-B of FIGS. 1A, 2A, 3A, 4A, 5A, 6A, 7A, 8A, 9A, 10A, 11A, 12A, 13A, 14A, and 15A, respectively. FIG. 7C illustrates a cross-sectional enlarged view of a section of the semiconductor device 100. FIG. 16 illustrates a cross-sectional view of the semiconductor device 100 at a stage of fabrication. FIG. 17 illustrates a top view of the semiconductor device 100 at a stage of fabrication.

In some embodiments, the semiconductor device 100 is a microelectromechanical systems (MEMS) device. A circuit is implemented by, is part of, and/or is coupled to the semiconductor device 100. In some embodiments, the circuit comprises a sensor circuit comprising at least one of an image sensor, a complementary metal-oxide-semiconductor (CMOS) image sensor (CIS), a backside CIS, a proximity sensor, a time of flight (ToF) sensor, an indirect ToF (iToF) sensor, a backside illumination (BSI) sensor, or other type of sensor. In some embodiments, the circuit comprises a logic circuit, a light-emitting diode (LED) circuit, a liquid-crystal display (LCD) circuit, a random access memory (RAM) circuit, or other type of circuit. Other structures and/or configurations of the semiconductor device 100 are within the scope of the present disclosure.

Figure 1B:
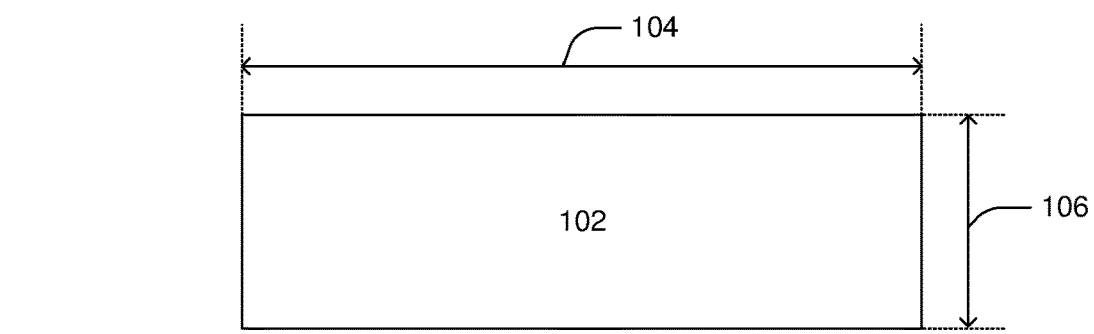

FIGS. 1A and 1B illustrate the semiconductor device 100 according to some embodiments. In some embodiments, the semiconductor device 100 comprises a first dielectric layer 102. The first dielectric layer 102 comprises at least one of silicon, nitride such as silicon nitride (SiN), oxide such as silicon dioxide ($SiO_2$), carbide such as silicon carbide (SiC), or other suitable material. Other structures and/or configurations of the first dielectric layer 102 are within the scope of the present disclosure. A length 106 of the first dielectric layer 102 is at least about 100,000 angstroms. A width 104 of the first dielectric layer 102 is at least about 100,000 angstroms. Other values of the length 106 and the width 104 are within the scope of the present disclosure.

Figure 2A:
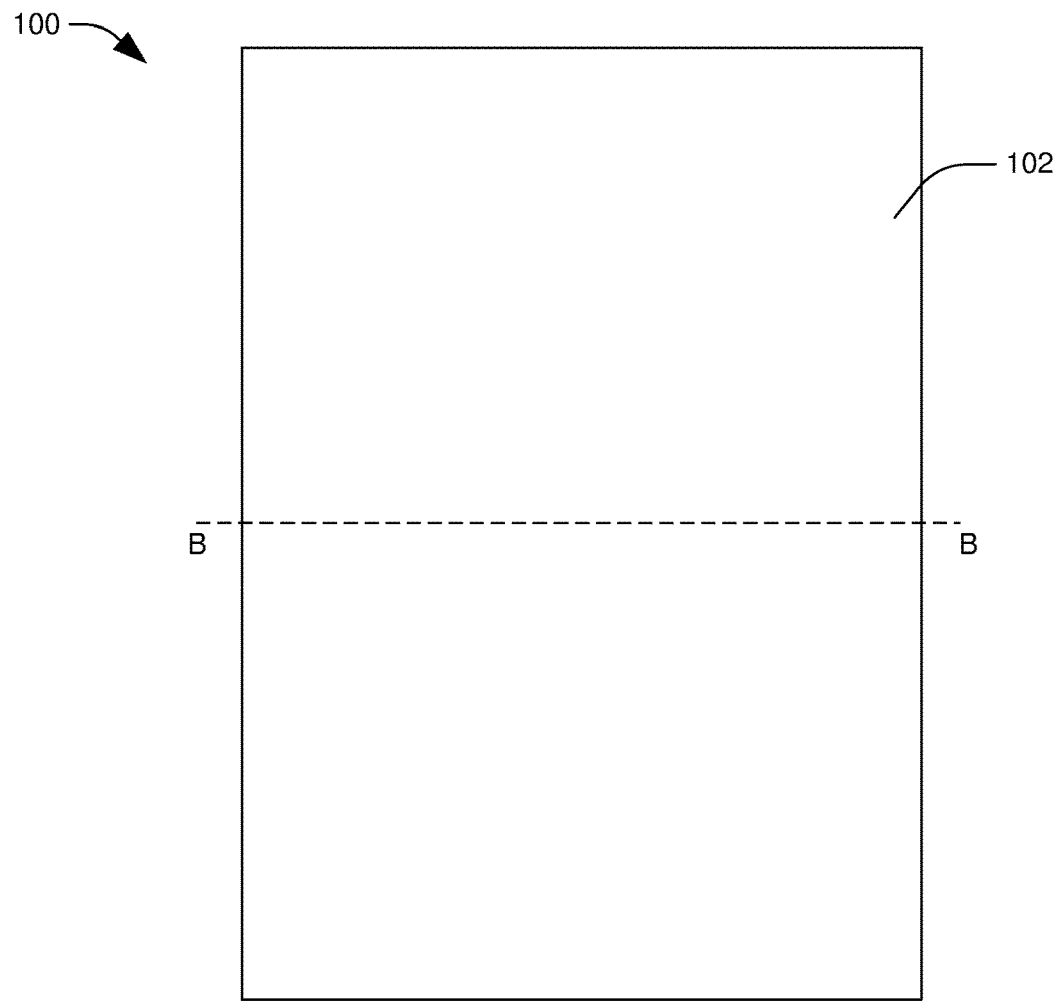
FIGS. 2A-2B illustrate a semiconductor device at a stage of fabrication, in accordance with some embodiments.
Figure 2B:
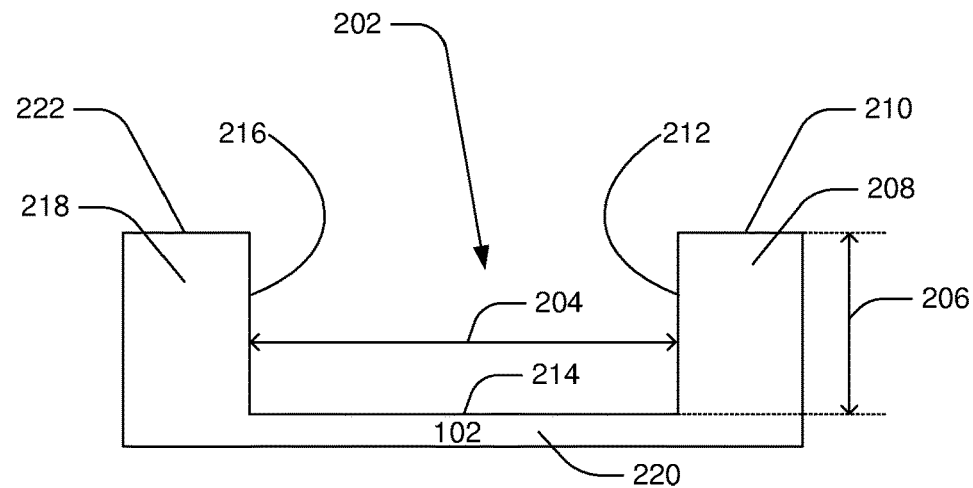

FIGS. 2A and 2B illustrate a first recess 202 formed in the first dielectric layer 102, according to some embodiments. A portion of the first dielectric layer 102 is removed to form the first recess 202. According to some embodiments, the first recess 202 is formed using a photoresist (not shown). The photoresist is formed over the first dielectric layer 102 by at least one of physical vapor deposition (PVD), sputtering, chemical vapor deposition (CVD), plasma enhanced CVD (PECVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques. The photoresist comprises a light-sensitive material, where properties, such as solubility, of the photoresist are affected by light. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist.

In some embodiments, an etching process is performed to remove a portion of the first dielectric layer 102 to form the first recess 202, where an opening in the photoresist allows one or more etchants applied during the etching process to remove the portion of the first dielectric layer 102 to form the first recess 202 while the photoresist protects or shields portions of the first dielectric layer 102 that are covered by the photoresist. The etching process is at least one of a dry etching process, a wet etching process, an anisotropic etching process, an isotropic etching process or other suitable etching process. The etching process uses at least one of fluorine, hydrogen fluoride (HF), diluted HF, sulfur hexafluoride ($SF_6$), a chlorine compound such as hydrogen chloride ($HCl_2$), hydrogen sulfide ($H_2S$), tetrafluoromethane ($CF_4$), or other suitable material. The photoresist is stripped or washed away after the first recess 202 is formed. Other processes and/or techniques for forming the first recess 202 are within the scope of the present disclosure.

The first recess 202 is defined by at least one of a first sidewall 216 of a first portion 218 of the first dielectric layer 102, a second sidewall 212 of a second portion 208 of the first dielectric layer 102, or a top surface 214 of a third portion 220 of the first dielectric layer 102. The third portion 220 is between the first portion 218 and the second portion 208, such that the third portion 220 is laterally offset from the first portion 218 and the second portion 208. A top surface 222 of the first portion 218 is level or coplanar with a top surface 210 of the second portion 208. Other structures and/or configurations of the first dielectric layer 102 and/or the first recess 202 are within the scope of the present disclosure. A distance 206 between the top surface 214 of the third portion 220 and at least one of the top surface 222 of the first portion 218 or the top surface 210 of the second portion 208 is greater than or equal to about 100,000 angstroms. A distance 204 between the first sidewall 216 of the first portion 218 and the second sidewall 212 of the second portion 208 is greater than or equal to about 100,000 angstroms. Other values of the distance 206 and the distance 204 are within the scope of the present disclosure.

Figure 3A:
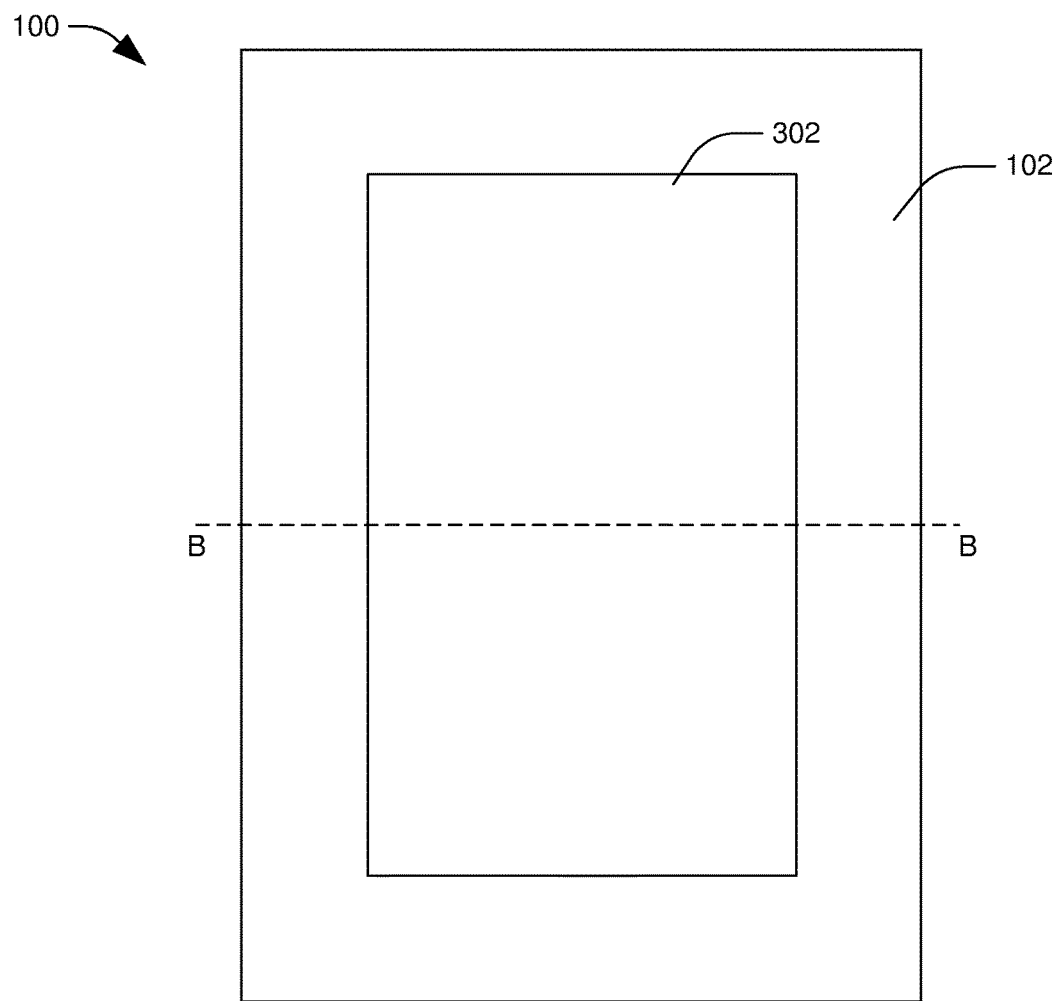
FIGS. 3A-3B illustrate a semiconductor device at a stage of fabrication, in accordance with some embodiments.
Figure 3B:
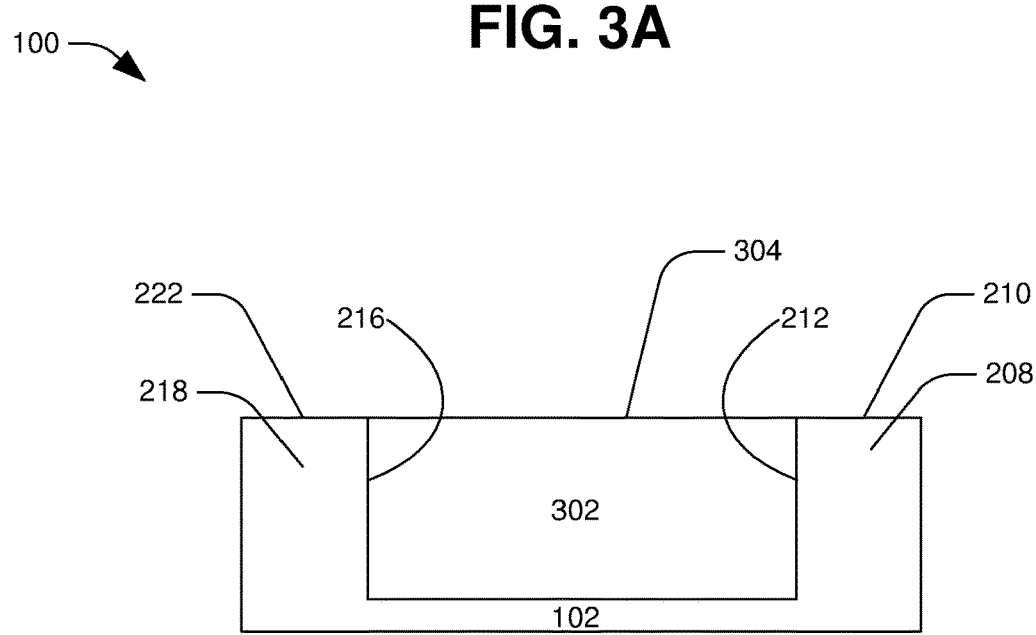

FIGS. 3A and 3B illustrate a structure 302 formed in the first recess 202, according to some embodiments. The structure 302 is formed by at least one of PVD, sputtering, CVD, PECVD, LPCVD, ALCVD, UHVCVD, RPCVD, ALD, MBE, LPE, spin on, growth, or other suitable techniques. According to some embodiments, a top surface 304 of the structure 302 is level or coplanar with at least one of the top surface 222 of the first portion 218 of the first dielectric layer 102 or the top surface 210 of the second portion 208 of the first dielectric layer 102. A material is deposited at least one of into the first recess 202 or over the first dielectric layer 102 to form the structure 302. In some embodiments, after depositing the material, a top portion of the material is removed by at least one of chemical-mechanical polishing (CMP), etching, or other suitable techniques. The top portion of the material is removed such that the top surface 304 of the structure 302 is level or coplanar with at least one of the top surface 222 of the first portion 218 of the first dielectric layer 102 or the top surface 210 of the second portion 208 of the first dielectric layer 102. Sidewalls of the structure 302 are at least one of in direct contact or in indirect contact with sidewalls of the first dielectric layer 102 defining the first recess 202, such as at least one of the first sidewall 216 or the second sidewall 212. Other structures and/or configurations of the structure 302 relative to other elements, features, etc. are within the scope of the present disclosure. The structure 302 comprises silicon, such as monocrystalline silicon, polycrystalline silicon, amorphous silicon, or other suitable material. Other materials, of the structure 302 are within the scope of the present disclosure.

Figure 4A:
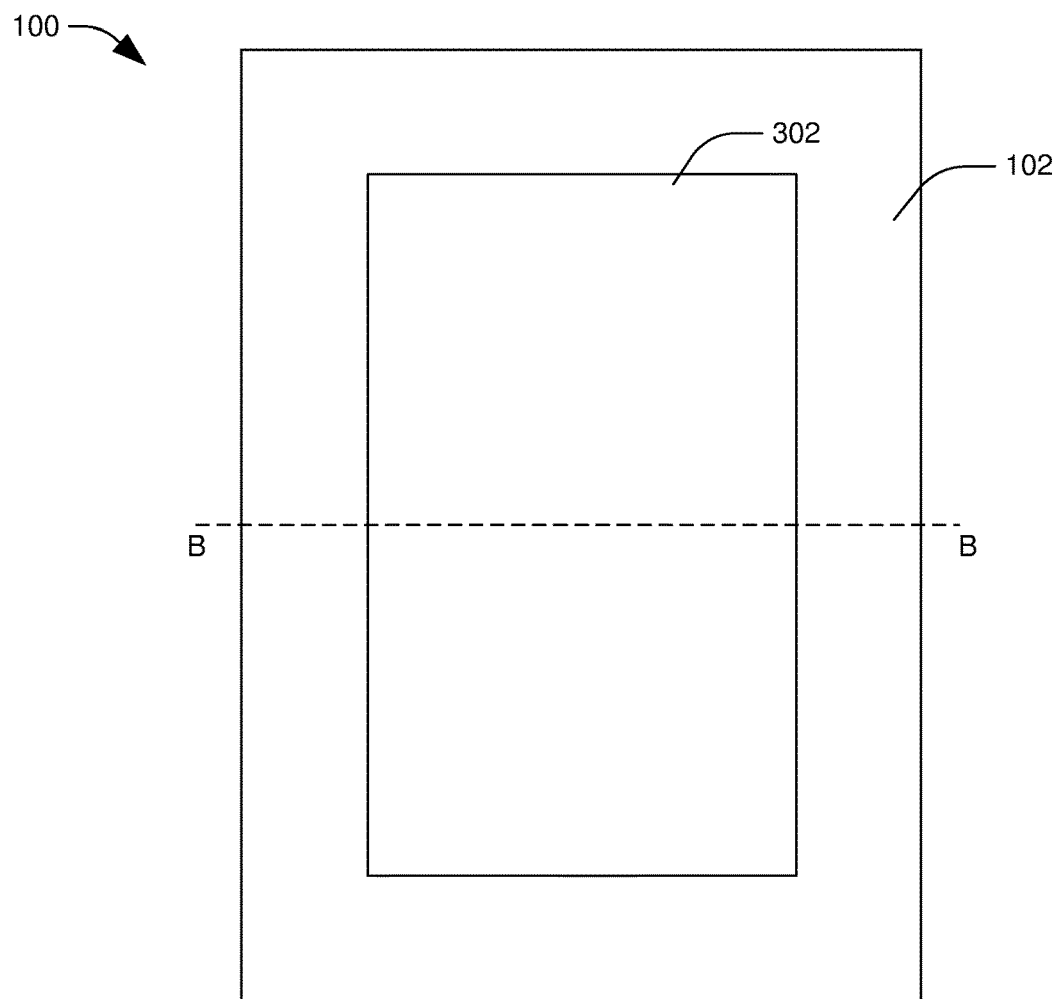
FIGS. 4A-4B illustrate a semiconductor device at a stage of fabrication, in accordance with some embodiments.
Figure 4B:
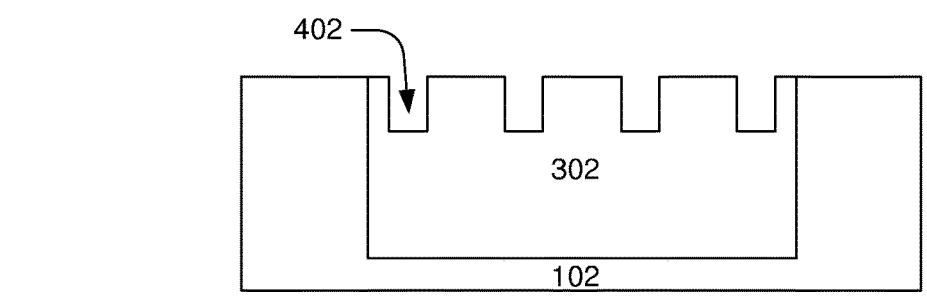

FIGS. 4A and 4B illustrate second recesses 402 formed in the structure 302, according to some embodiments. Portions of the structure 302 are removed to form the second recesses 402. According to some embodiments, the second recesses 402 are formed using a photoresist (not shown). The photoresist is formed over at least one of the structure 302 or the first dielectric layer 102 by at least one of PVD, sputtering, CVD, PECVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist.

In some embodiments, an etching process is performed to remove portions of the structure 302 to form the second recesses 402, where openings in the photoresist allow one or more etchants applied during the etching process to remove the portions of the structure 302 to form the second recesses 402 while the photoresist protects or shields portions of at least one of the structure 302 or the first dielectric layer 102 that are covered by the photoresist. The etching process is at least one of a dry etching process, a wet etching process, an anisotropic etching process, an isotropic etching process or other suitable etching process. The etching process uses at least one of fluorine, HF, diluted HF, SF6, a chlorine compound such as $HCl_2$, $H_2S$, $CF_4$, or other suitable material. The photoresist is stripped or washed away after the second recesses 402 are formed. Other processes and/or techniques for forming the second recesses 402 are within the scope of the present disclosure.

Figure 5A:
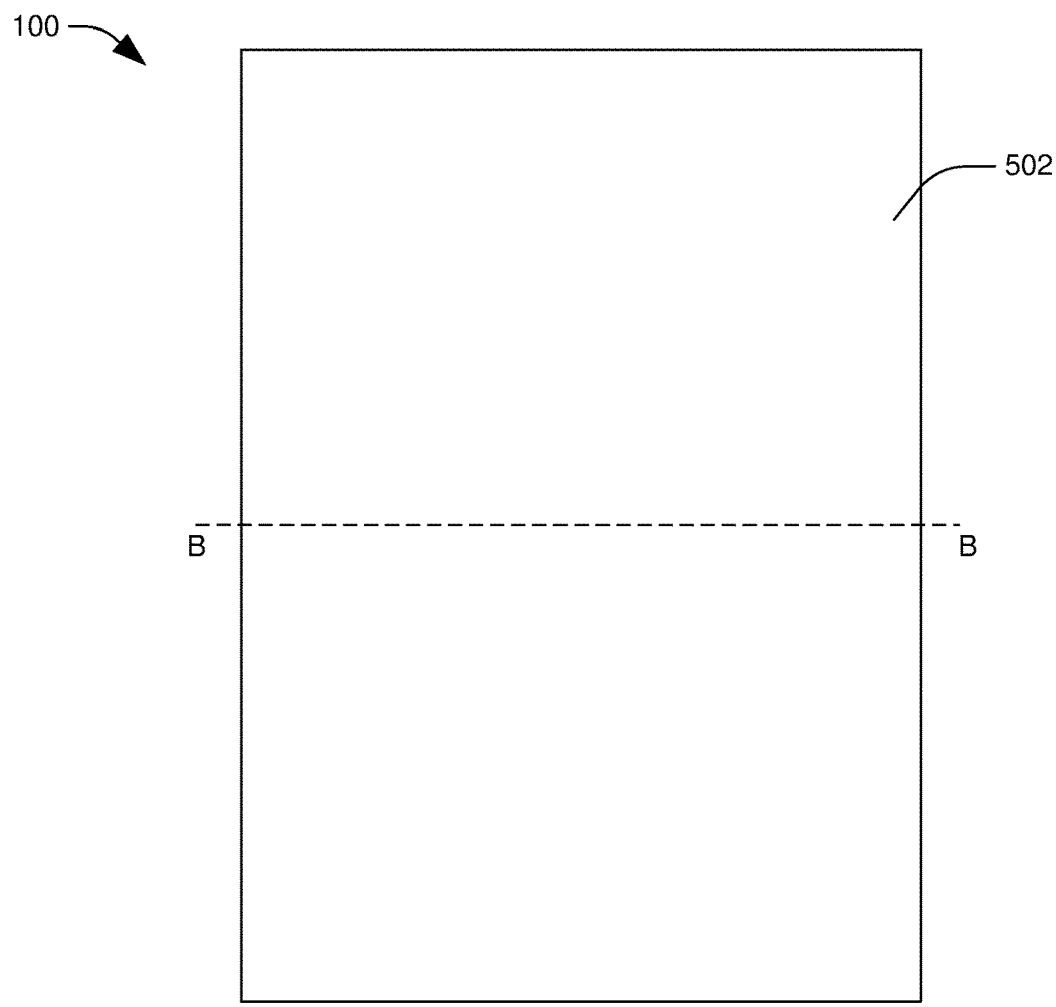
FIGS. 5A-5B illustrate a semiconductor device at a stage of fabrication, in accordance with some embodiments.
Figure 5B:
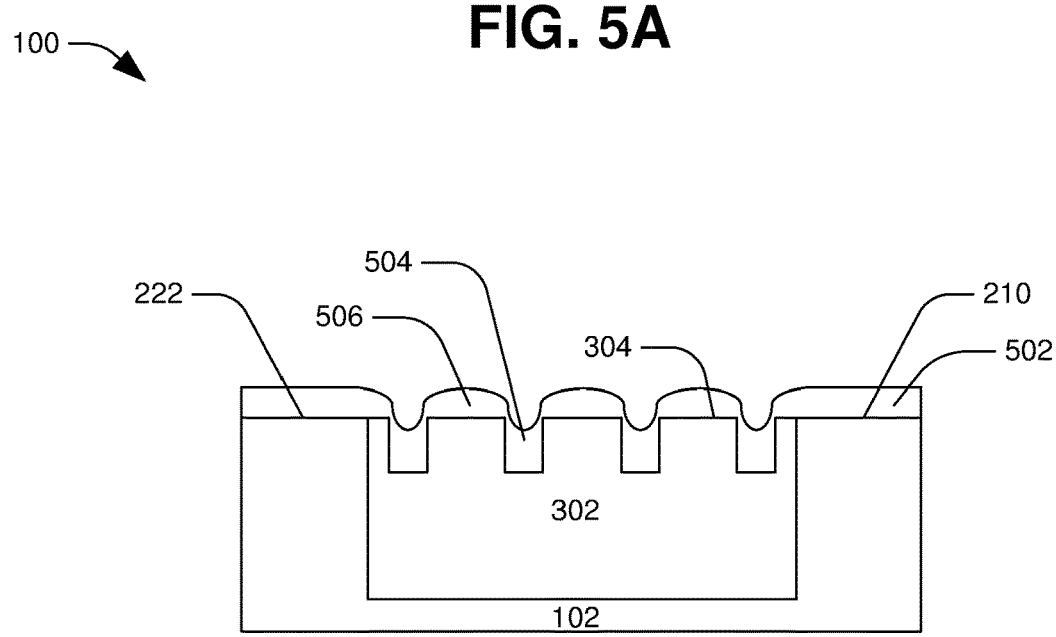

FIGS. 5A and 5B illustrate a first layer 502 formed over at least one of the structure 302 or the first dielectric layer 102. The first layer 502 is formed by at least one of PVD, sputtering, CVD, PECVD, LPCVD, ALCVD, UHVCVD, RPCVD, ALD, MBE, LPE, spin on, growth, or other suitable techniques. The first layer 502 at least one of overlies the structure 302, is in direct contact with the top surface 304 of the structure 302 or is in indirect contact with the top surface 304 of the structure 302. The first layer 502 at least one of overlies the first dielectric layer 102, is in direct contact with the top surface 222 and the top surface 210 of the first dielectric layer 102 or is in indirect contact with the top surface 222 and the top surface 210 of the first dielectric layer 102. According to some embodiments, the first layer 502 comprises silicon, such as monocrystalline silicon, polycrystalline silicon, amorphous silicon, or other suitable material. The first layer 502 is different than the structure 302, such as having a different material composition, such that an interface is defined between the first layer 502 and the structure 302. In some embodiments, the first layer 502 does not have a material composition different than the structure 302. An interface is nevertheless defined between the first layer 502 and the structure 302 because the first layer 502 and the structure 302 are separate, different, etc. from each other. A first portion 504 of the first layer 502 is in a second recess 402 of the structure 302 and a second portion 506 of the first layer 502 overlies the top surface 304 of the structure 302. In some embodiments, an uppermost surface of the second portion 506 is above an uppermost surface of the first portion 504 due to a conformity of the first layer 502. Sidewalls of the first portion 504 are at least one of in direct contact with sidewalls of the structure 302 defining the second recess 402 or in indirect contact with sidewalls of the structure 302 defining the second recess 402. Other materials, structures and/or configurations of the first layer 502 are within the scope of the present disclosure.

Figure 6A:
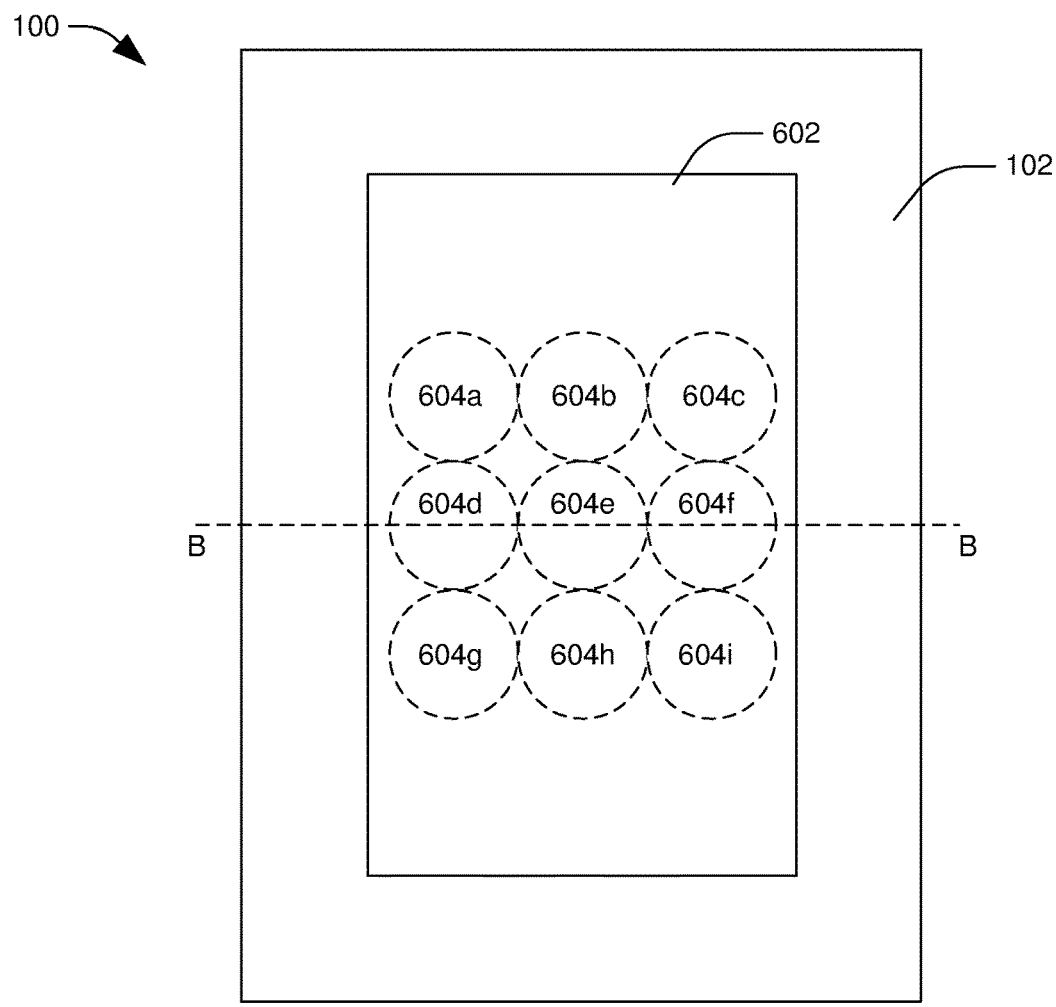
FIGS. 6A-6B illustrate a semiconductor device at a stage of fabrication, in accordance with some embodiments.
Figure 6B:
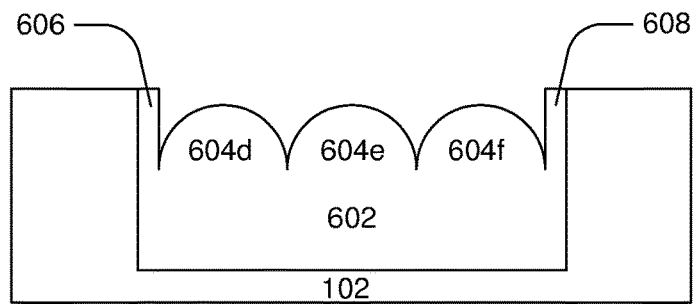

FIGS. 6A and 6B illustrate a damper template 602 formed from at least one of the structure 302 or the first layer 502, according to some embodiments. In some embodiments, an etching process is performed to remove portions of at least one of the first layer 502 or the structure 302 to form the damper template 602. In some embodiments, the etching process is performed without the use of a photoresist or a mask overlying the structure 302 or the first layer 502. The etching process is at least one of a dry etching process, a wet etching process, an anisotropic etching process, an isotropic etching process or other suitable etching process. The etching process uses at least one of fluorine, HF, diluted HF, $SF_6$, a chlorine compound such as $HCl_2$, $H_2S$, $CF_4$, or other suitable material. Other processes and/or techniques for forming the damper template 602 are within the scope of the present disclosure.

The damper template 602 comprises at least one of one or more mechanical deflector templates 604, a first template wall 606, or a second template wall 608. The one or more mechanical deflector templates 604 are between the first template wall 606 and the second template wall 608. In some embodiments, at least one of an uppermost surface of the first template wall 606 or an uppermost surface of the second template wall 608 is above an uppermost surface of a mechanical deflector template of the one or more mechanical deflector templates 604. A mechanical deflector template of the one or more mechanical deflector templates 604 has a hemispherical shape, an inverse U-shape, or other suitable shape. Dashed-line circles in FIG. 6A show outer circumferences of the one or more mechanical deflector templates 604 according to some embodiments. Even though nine mechanical deflector templates 604 are depicted, any number of mechanical deflector templates 604 are contemplated, according to some embodiments. In some embodiments, the one or more mechanical deflector templates 604 are arranged across one or more rows comprising at least one of a first row of mechanical deflector templates, a second row of mechanical deflector templates or a third row of mechanical deflector templates. In some embodiments, the first row of mechanical deflector templates comprises at least one of a mechanical deflector template 604a, a mechanical deflector template 604b, or a mechanical deflector template 604c, the second row of mechanical deflector templates comprises at least one of a mechanical deflector template 604d, a mechanical deflector template 604e, or a mechanical deflector template 604f, and the third row of mechanical deflector templates comprises at least one of a mechanical deflector template 604g, a mechanical deflector template 604h, or a mechanical deflector template 604i. Even though three mechanical deflector templates 604 per row are depicted, any number of mechanical deflector templates 604 per row are contemplated, according to some embodiments. Further, embodiments are contemplated in which a number of mechanical deflector templates 604 of a first row differs from a number of mechanical deflector templates 604 of a second row. Even though three rows of mechanical deflector templates 604 are depicted, any number of rows of mechanical deflector templates 604 are contemplated, according to some embodiments. Other structures and/or configurations of the damper template 602 are within the scope of the present disclosure.

Figure 7A:
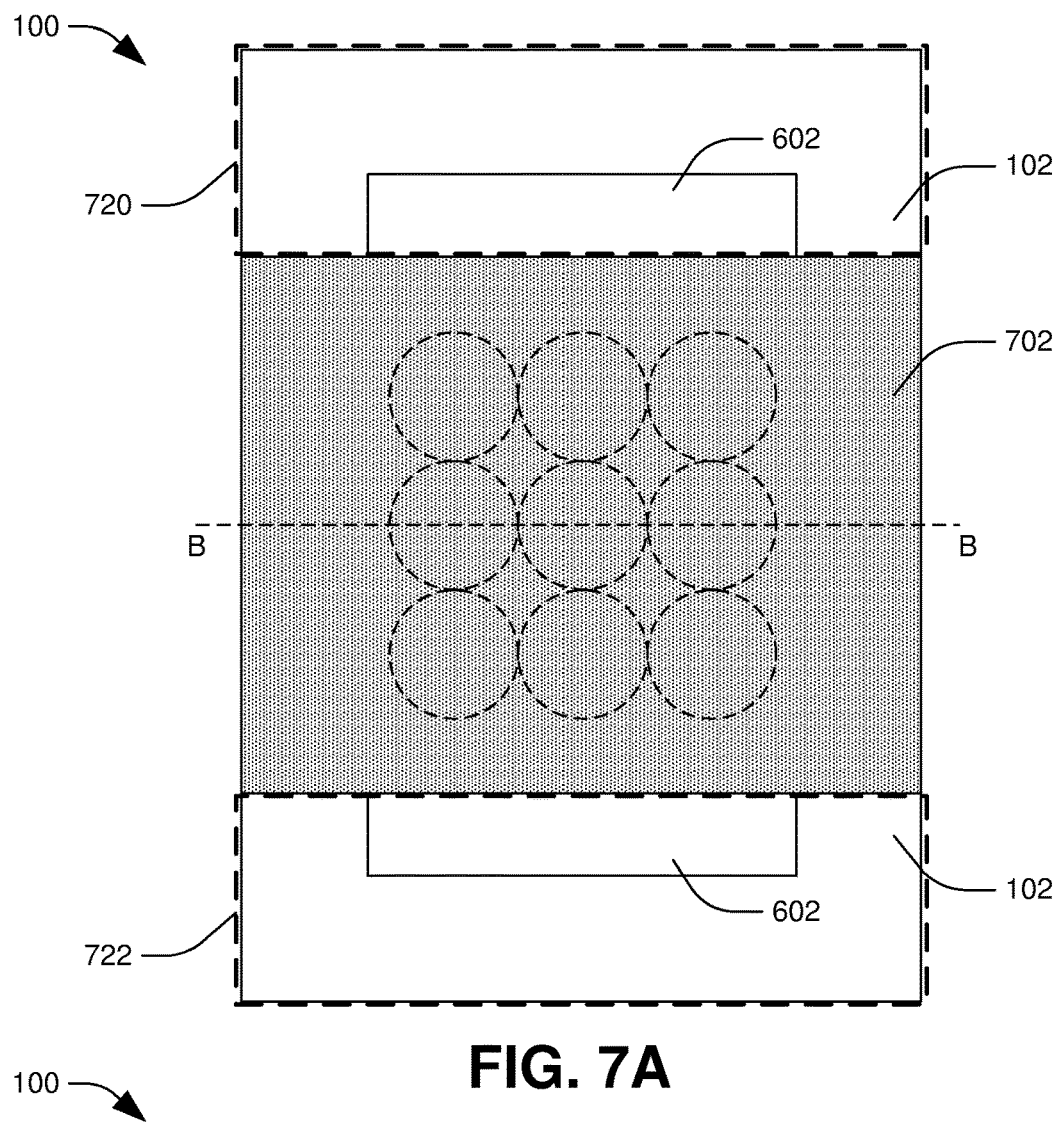
FIGS. 7A-7C illustrate a semiconductor device at a stage of fabrication, in accordance with some embodiments.
Figure 7B:
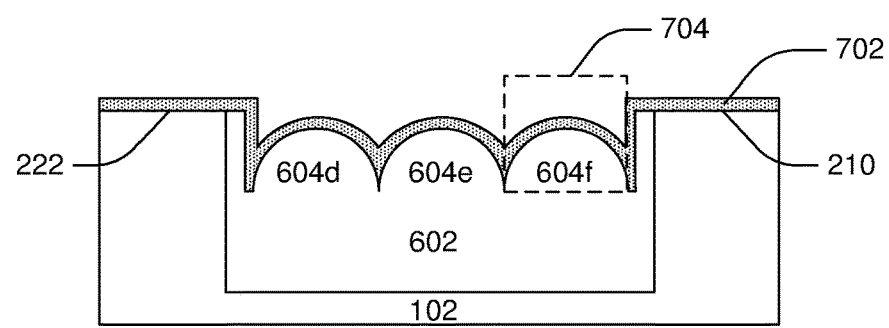
Figure 7C:
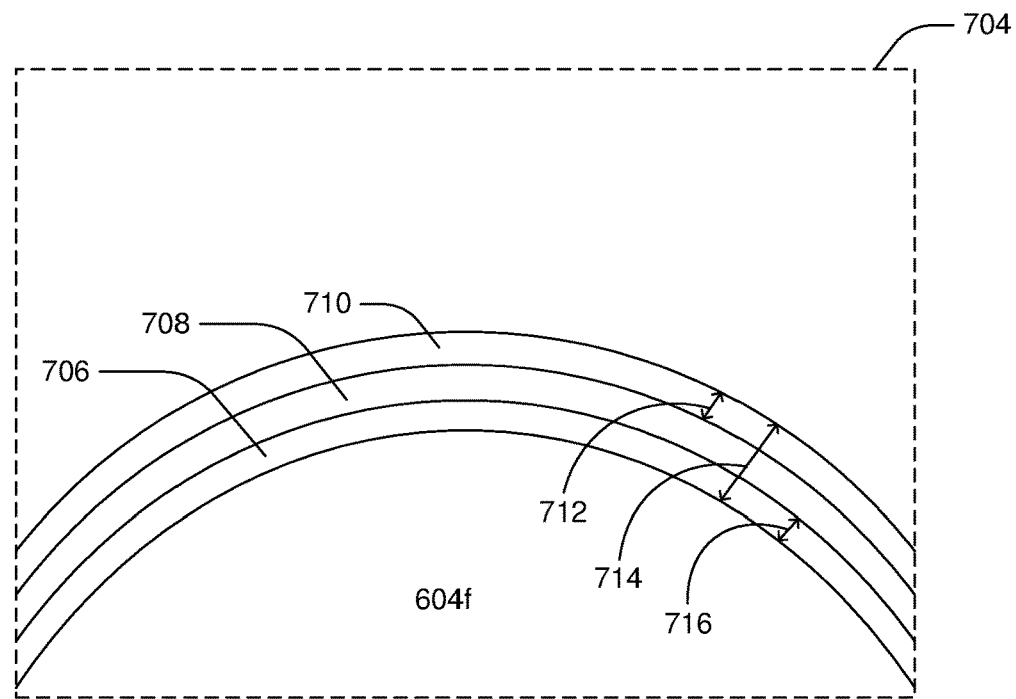

FIGS. 7A, 7B and 7C illustrate one or more damper layers 702 formed over at least one of the damper template 602 or the first dielectric layer 102. The one or more damper layers 702 are formed by at least one of PVD, sputtering, CVD, PECVD, LPCVD, ALCVD, UHVCVD, RPCVD, ALD, MBE, LPE, spin on, growth, or other suitable techniques. A layer of the one or more damper layers 702, such as a bottom layer of the one or more damper layers 702, at least one of overlies the damper template 602, is in direct contact with a top surface of the damper template 602 or is in indirect contact with the top surface of the damper template 602. A layer of the one or more damper layers 702, such as the bottom layer of the one or more damper layers 702, at least one of overlies the first dielectric layer 102, is in direct contact with the top surface 222 and the top surface 210 of the first dielectric layer 102 or is in indirect contact with the top surface 222 and the top surface 210 of the first dielectric layer 102. In some embodiments, the one or more damper layers 702 conform to a shape of the top surface of the damper template 602. Dashed-line circles in FIG. 7A show outer circumferences of portions of the one or more damper layers 702 that conform to the one or more mechanical deflector templates 604 of the damper template 602, according to some embodiments. In some embodiments, the portions of the one or more damper layers 702 have a shape, such as a hemispherical shape, an inverse-U shape, or other suitable shape, corresponding to a shape of the one or more mechanical deflector templates 604. Other structures and/or configurations of the one or more damper layers 702 are within the scope of the present disclosure.

In some embodiments, one or more portions (not shown) of the one or more damper layers 702 are removed to expose one or more sections of the semiconductor device 100. The one or more sections comprise at least one of a first section 720 (depicted in FIG. 7A), comprising a portion of the first dielectric layer 102 and a portion of the damper template 602, or a second section 722 (depicted in FIG. 7A) comprising a portion of the first dielectric layer 102 and a portion of the damper template 602. According to some embodiments, the one or more portions are removed using a photoresist (not shown). The photoresist is formed over at least one of the one or more damper layers 702 or the first dielectric layer 102 by at least one of PVD, sputtering, CVD, PECVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist.

In some embodiments, an etching process is performed to remove the one or more portions of the one or more damper layers 702 to expose the one or more sections, where openings in the photoresist allow one or more etchants applied during the etching process to remove the one or more portions of the one or more damper layers 702 while the photoresist protects or shields portions of the one or more damper layers 702 that are covered by the photoresist. The etching process is at least one of a dry etching process, a wet etching process, an anisotropic etching process, an isotropic etching process or other suitable etching process. The etching process uses at least one of fluorine, HF, diluted HF, SF6, a chlorine compound such as HCl2, H2S, CF4, or other suitable material. The photoresist is stripped or washed away after the one or more sections are exposed. Other processes and/or techniques for removing the one or more portions of the one or more damper layers 702 and/or exposing the one or more sections are within the scope of the present disclosure.

FIG. 7C illustrates an enlarged view of a third section 704 (depicted in FIG. 7B) of the semiconductor device 100, according to some embodiments. The third section 704 comprises a portion of the one or more damper layers 702. The one or more damper layers 702 comprise at least one of a first damper layer 706, a second damper layer 708, or a third damper layer 710.

The first damper layer 706 is formed over at least one of the damper template 602 or the first dielectric layer 102. The first damper layer 706 is formed by at least one of PVD, sputtering, CVD, PECVD, LPCVD, ALCVD, UHVCVD, RPCVD, ALD, MBE, LPE, spin on, growth, or other suitable techniques. The first damper layer 706 at least one of overlies the damper template 602, is in direct contact with a top surface of the damper template 602 or is in indirect contact with the top surface of the damper template 602. The first damper layer 706 comprises at least one of a first metal or other suitable material. The first metal comprises at least one of titanium (Ti), tantalum (Ta), aluminum (Al), copper (Cu), tungsten (W), aluminum copper (AlCu), or other suitable metal. Other materials, structures and/or configurations of the first damper layer 706 are within the scope of the present disclosure.

The second damper layer 708 is formed over the first damper layer 706. The second damper layer 708 is formed by at least one of PVD, sputtering, CVD, PECVD, LPCVD, ALCVD, UHVCVD, RPCVD, ALD, MBE, LPE, spin on, growth, or other suitable techniques. The second damper layer 708 at least one of overlies the first damper layer 706, is in direct contact with a top surface of the first damper layer 706 or is in indirect contact with the top surface of the first damper layer 706. The second damper layer 708 comprises at least one of a non-metal or other suitable material. The non-metal comprises at least one of at least one of monocrystalline material, polycrystalline material, silicon, monocrystalline silicon, polycrystalline silicon, amorphous silicon, nitride such as SiN, oxide such as $SiO_2$, SiON, carbide such as SiC, or other suitable material. In some embodiments, the non-metal is at least one of a low-k material or an extreme low-k material. As used herein, the term "low-k material" refers to a material having a dielectric constant, k, lower than about 3.9. Some low-k dielectric materials have a dielectric constant lower than about 3.5. As used herein, the term "extreme low-k material" refers to a material having a dielectric constant, k, lower than about 2.5. Other materials, structures and/or configurations of the second damper layer 708 are within the scope of the present disclosure.

The third damper layer 710 is formed over the second damper layer 708. The third damper layer 710 is formed by at least one of PVD, sputtering, CVD, PECVD, LPCVD, ALCVD, UHVCVD, RPCVD, ALD, MBE, LPE, spin on, growth, or other suitable techniques. The third damper layer 710 at least one of overlies the second damper layer 708, is in direct contact with a top surface of the second damper layer 708 or is in indirect contact with the top surface of the second damper layer 708. The third damper layer 710 comprises at least one of a second metal or other suitable material. The second metal comprises at least one of Ti, Ta, Al, Cu, W, AlCu, or other suitable metal. The second metal is different than the first metal or the second metal is not different than the first metal. Other materials, structures and/or configurations of the third damper layer 710 are within the scope of the present disclosure.

In some embodiments, a thickness 712 of the third damper layer 710 is greater than a thickness 716 of the first damper layer 706. The thickness 712 of the third damper layer 710 is between about 105% and about 135% of the thickness 716 of the first damper layer 706, such as between about 115% and about 125% of the thickness 716 of the first damper layer 706. Other configurations of the thickness 712 of the third damper layer 710 and the thickness 716 relative to each other are within the scope of the present disclosure. A thickness 714 of the one or more damper layers 702 is at least about 200 angstroms. Other values of the thickness 714 are within the scope of the present disclosure.

In some embodiments, at least one of a material composition, a concentration, a grain size, or a hardness of the first damper layer 706 is substantially similar to a material composition, a concentration, a grain size, or a hardness of the third damper layer 710. At least one of the hardness of the first damper layer 706 or the hardness of the third damper layer 710 is greater than a hardness of the second damper layer 708. Other properties and/or configurations of the one or more damper layers 702 are within the scope of the present disclosure.

Other embodiments of the one or more damper layers 702 are provided. In some embodiments, the first damper layer 706 comprises a non-metal, the second damper layer 708 comprises a metal, and the third damper layer 710 comprises a non-metal. In some embodiments, the first damper layer 706 comprises an oxide such as $SiO_2$, the second damper layer 708 comprises a metal, and the third damper layer 710 comprises an oxide such as $SiO_2$. In some embodiments, the first damper layer 706 comprises a nitride such as SiN, the second damper layer 708 comprises a metal, and the third damper layer 710 comprises a nitride such as SiN. In some embodiments, the first damper layer 706 comprises a polycrystalline material such as polycrystalline silicon, the second damper layer 708 comprises a metal, and the third damper layer 710 comprises a polycrystalline material such as polycrystalline silicon. In some embodiments, the one or more damper layers 702 are a single layer comprising at least one of a metal or other suitable material. Importantly or critically, at least some of the one or more damper layers 702 are formed, such as with regard to material composition, thickness and/or other dimension(s), hardness, etc. to provide desired damping.

Figure 8A:
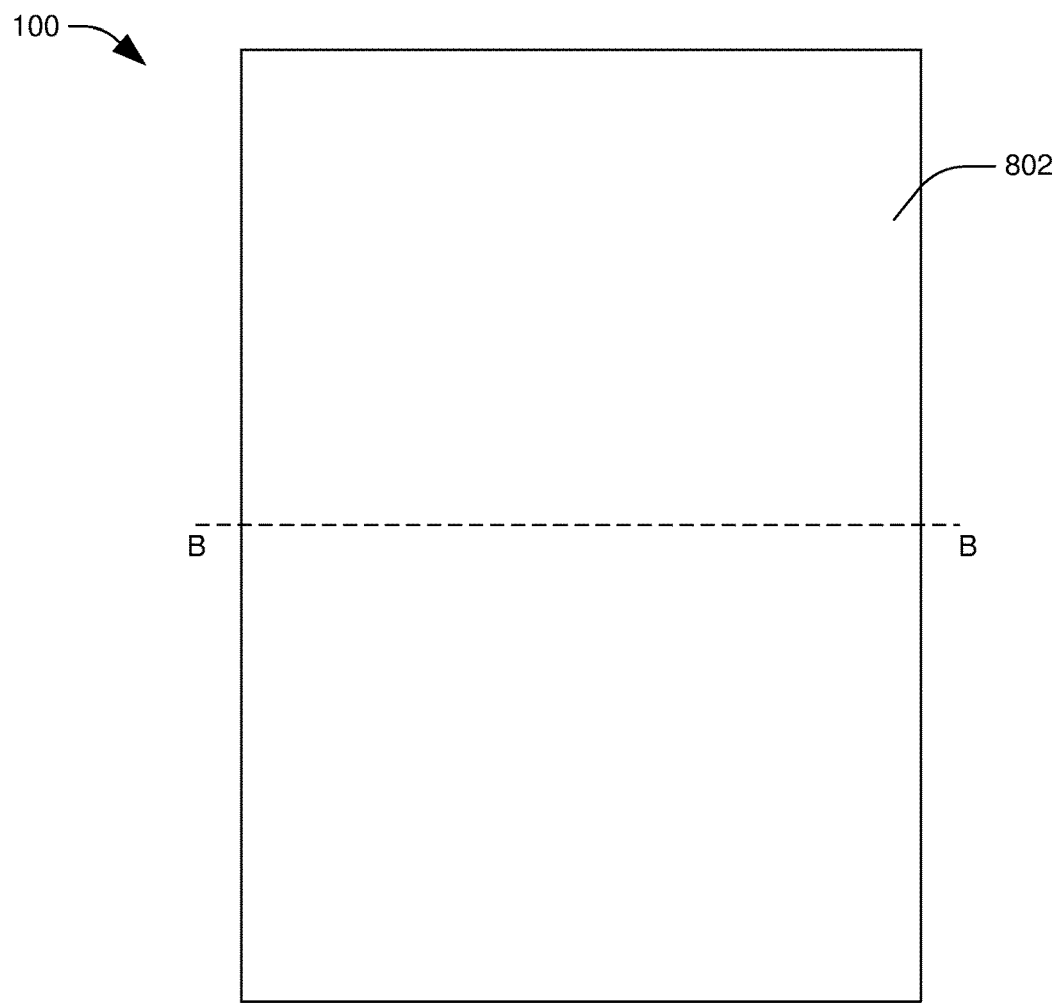
FIGS. 8A-8B illustrate a semiconductor device at a stage of fabrication, in accordance with some embodiments.
Figure 8B:
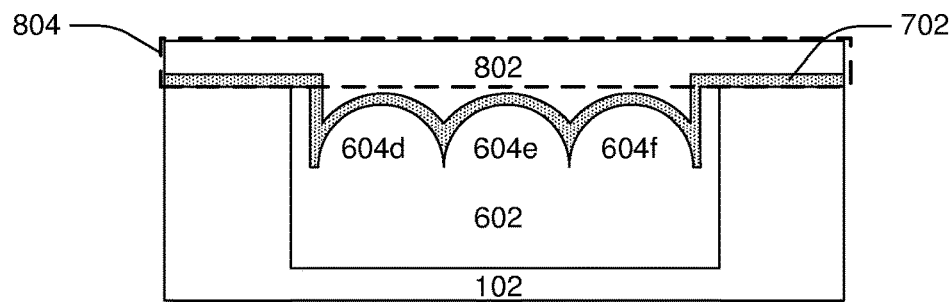

FIGS. 8A and 8B illustrate a second layer 802 formed over at least one of the one or more damper layers 702, the damper template 602 or the first dielectric layer 102. The second layer 802 is formed by at least one of PVD, sputtering, CVD, PECVD, LPCVD, ALCVD, UHVCVD, RPCVD, ALD, MBE, LPE, spin on, growth, or other suitable techniques. The second layer 802 at least one of overlies the one or more damper layers 702, is in direct contact with a top surface of the one or more damper layers 702 or is in indirect contact with the top surface of the one or more damper layers 702. According to some embodiments, the second layer 802 comprises silicon, such as monocrystalline silicon, polycrystalline silicon, amorphous silicon, or other suitable material. Other materials, structures and/or configurations of the second layer 802 are within the scope of the present disclosure.

Figure 9A:
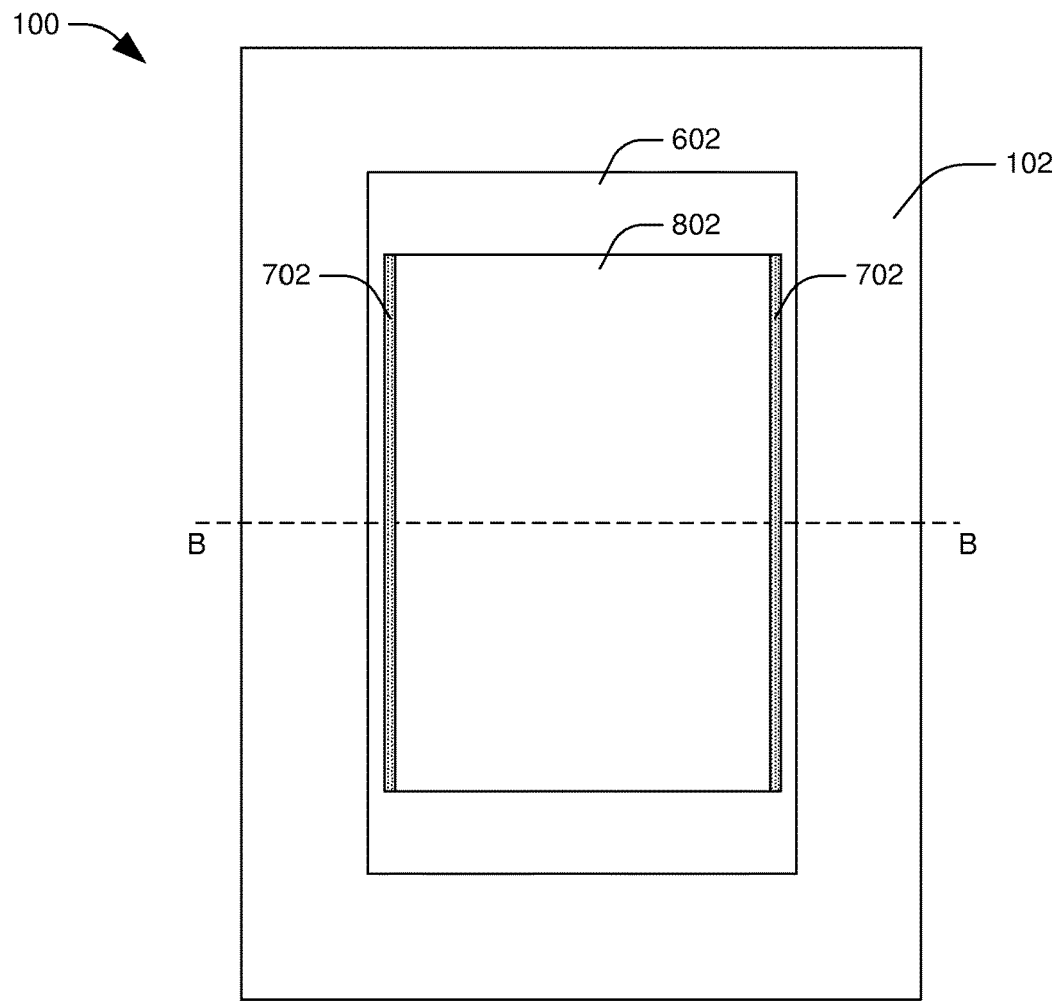
FIGS. 9A-9B illustrate a semiconductor device at a stage of fabrication, in accordance with some embodiments.
Figure 9B:
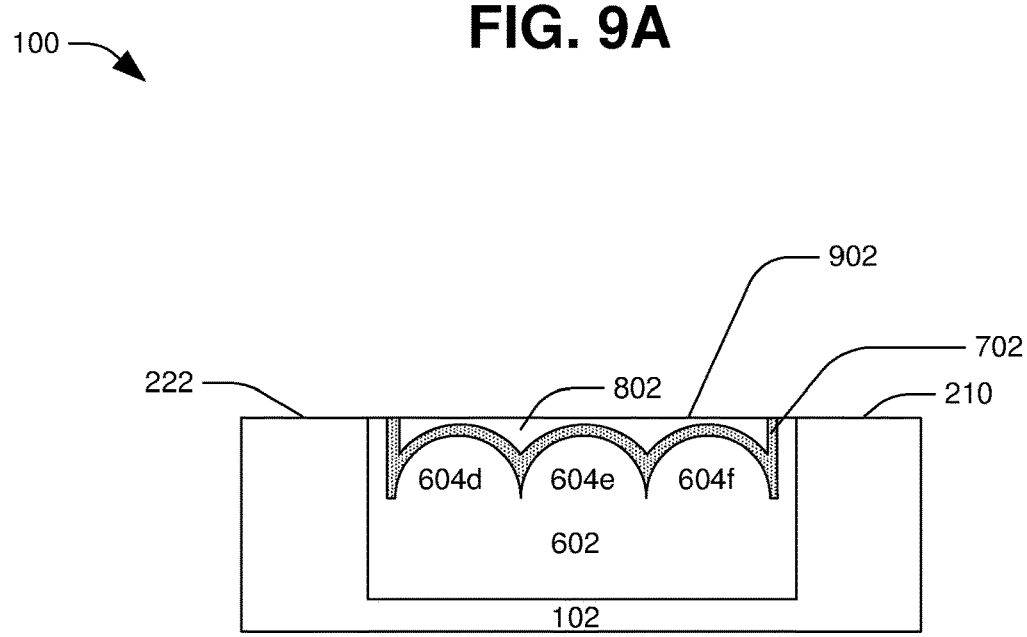

FIGS. 9A and 9B illustrate removal of a fourth section 804 (depicted in FIG. 8B) of the semiconductor device 100, according to some embodiments. In some embodiments, the fourth section 804 is removed by at least one of CMP, etching, or other suitable techniques. The fourth section 804 comprises a top section of the semiconductor device 100 that is over the first dielectric layer 102, such as a section of the semiconductor device 100 that is above the top surface 222 and the top surface 210 of the first dielectric layer 102. The fourth section 804 comprises at least one of a portion of the second layer 802 that is above the top surface 222 and the top surface 210 of the first dielectric layer 102, or a portion of the one or more damper layers 702 that is above the top surface 222 and the top surface 210 of the first dielectric layer 102. In some embodiments, removal of the fourth section 804 of the semiconductor device 100 exposes the top surface 222 and the top surface 210 of the first dielectric layer 102. In some embodiments, the fourth section 804 of the semiconductor device 100 is removed such that a top surface 902 of the second layer 802 is level or coplanar with the top surface 222 and the top surface 210 of the first dielectric layer 102.

Figure 10A:
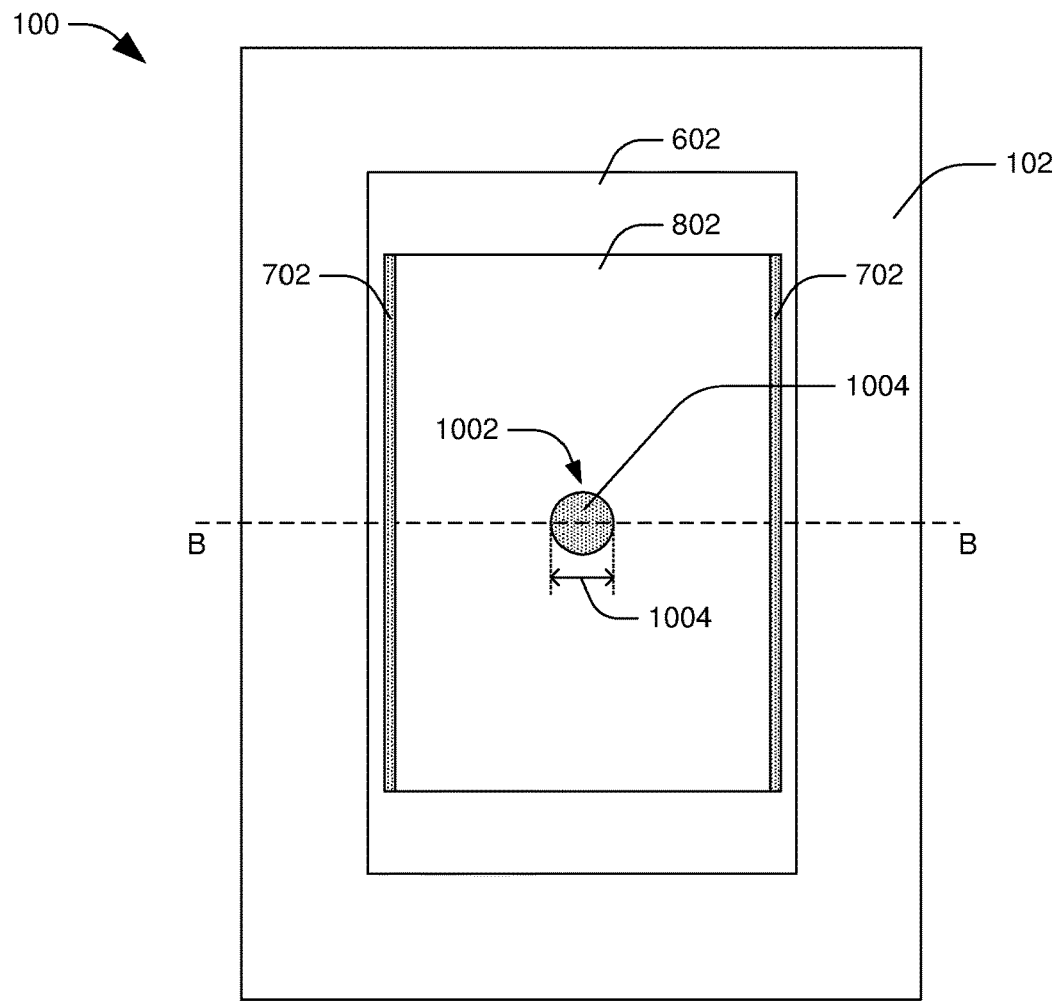
FIGS. 10A-10B illustrate a semiconductor device at a stage of fabrication, in accordance with some embodiments.
Figure 10B:
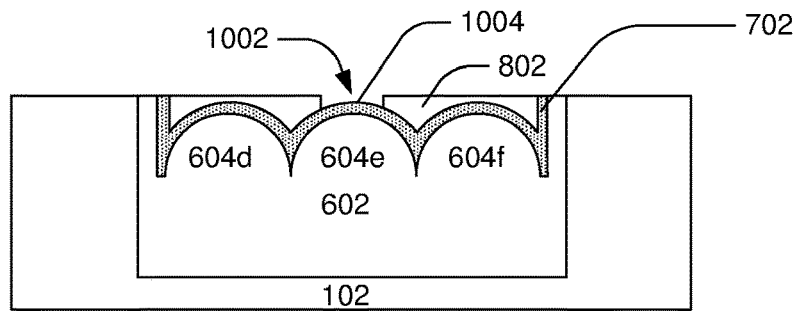

FIGS. 10A and 10B illustrate a first opening 1002 formed in the second layer 802, according to some embodiments. A portion of the second layer 802 is removed to form the first opening 1002. The first opening 1002 exposes a portion 1004 of the one or more damper layers 702, such as a portion of a top surface of the third damper layer 710. According to some embodiments, the first opening 1002 is formed using a photoresist (not shown). The photoresist is formed over at least one of the second layer 802 or the first dielectric layer 102 by at least one of PVD, sputtering, CVD, PECVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist.

In some embodiments, an etching process is performed to remove a portion of the second layer 802 to form the first opening 1002, where an opening in the photoresist allows one or more etchants applied during the etching process to remove the portion of the second layer 802 to form the first opening 1002 while the photoresist protects or shields portions of at least one of the second layer 802 or the first dielectric layer 102 that are covered by the photoresist. The etching process is at least one of a dry etching process, a wet etching process, an anisotropic etching process, an isotropic etching process or other suitable etching process. The etching process uses at least one of fluorine, HF, diluted HF, $SF_6$, a chlorine compound such as $HCl_2$, $H_2S$, $CF_4$, or other suitable material. The photoresist is stripped or washed away after the first opening 1002 is formed. Other processes and/or techniques for forming the first opening 1002 are within the scope of the present disclosure.

Figure 11A:
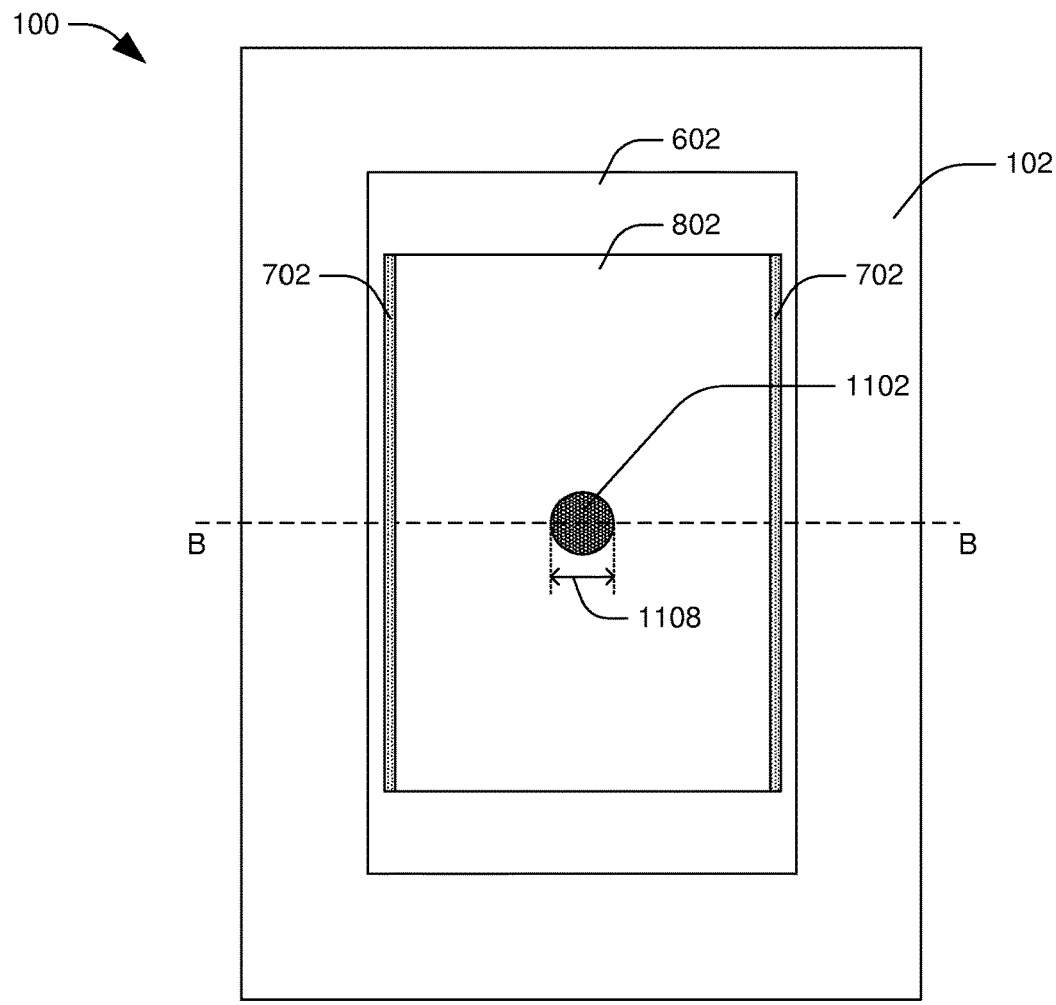
FIGS. 11A-11B illustrate a semiconductor device at a stage of fabrication, in accordance with some embodiments.
Figure 11B:
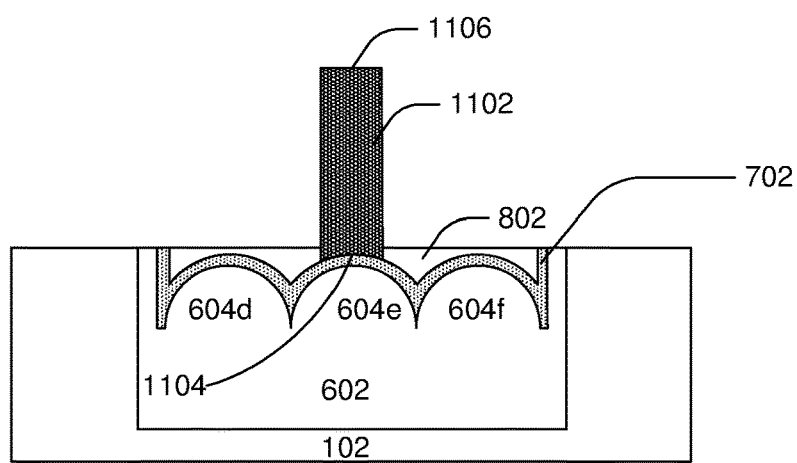

FIGS. 11A and 11B illustrate a post 1102 formed over the one or more damper layers 702, according to some embodiments. The post 1102 is formed by at least one of PVD, sputtering, CVD, PECVD, LPCVD, ALCVD, UHVCVD, RPCVD, ALD, MBE, LPE, spin on, growth, or other suitable techniques. The post 1102 is formed through the first opening 1002. The post 1102 at least one of overlies the portion 1004 (depicted in FIG. 10B) of the one or more damper layers 702, is in direct contact with the portion 1004 of the one or more damper layers 702 or is in indirect contact with the portion 1004 of the one or more damper layers 702. A first end 1104 of the post 1102 is coupled to the portion 1004 of the one or more damper layers 702. In some embodiments, the first end 1104 of the post 1102 is bonded with the portion 1004 of the one or more damper layers 702, such as by at least one of one or more metal-to-metal bonding techniques, an adhesive, a bonding process, or other suitable techniques. In some embodiments, a second end 1106 of the post 1102 is configured to be coupled to a chip holder (not shown in FIGS. 11A-11B). The third damper layer 710 comprises at least one of a third metal or other suitable material. The third metal comprises at least one of Ti, Ta, Al, Cu, W, AlCu, or other suitable metal. The post 1102 has a cylindrical shape or other suitable shape. A diameter 1108 (depicted in FIG. 11A) of the post 1102 is at least about 2,000 angstroms. Other values of the diameter 1108 are within the scope of the present disclosure. Other materials, structures and/or configurations of the post 1102 are within the scope of the present disclosure.

The second metal is deposited at least one of into the first opening 1002 or over the second layer 802 to form the post 1102. In some embodiments, after depositing the second metal, one or more portions of the second metal is removed by at least one of CMP, etching, or other suitable techniques. The one or more portions of the second metal are removed such that the post 1102 has a cylindrical shape or other suitable shape. In some embodiments, the one or more portions of the second metal are removed using a photoresist (not shown). Other processes and/or techniques for forming the post 1102 are within the scope of the present disclosure.

Figure 12A:
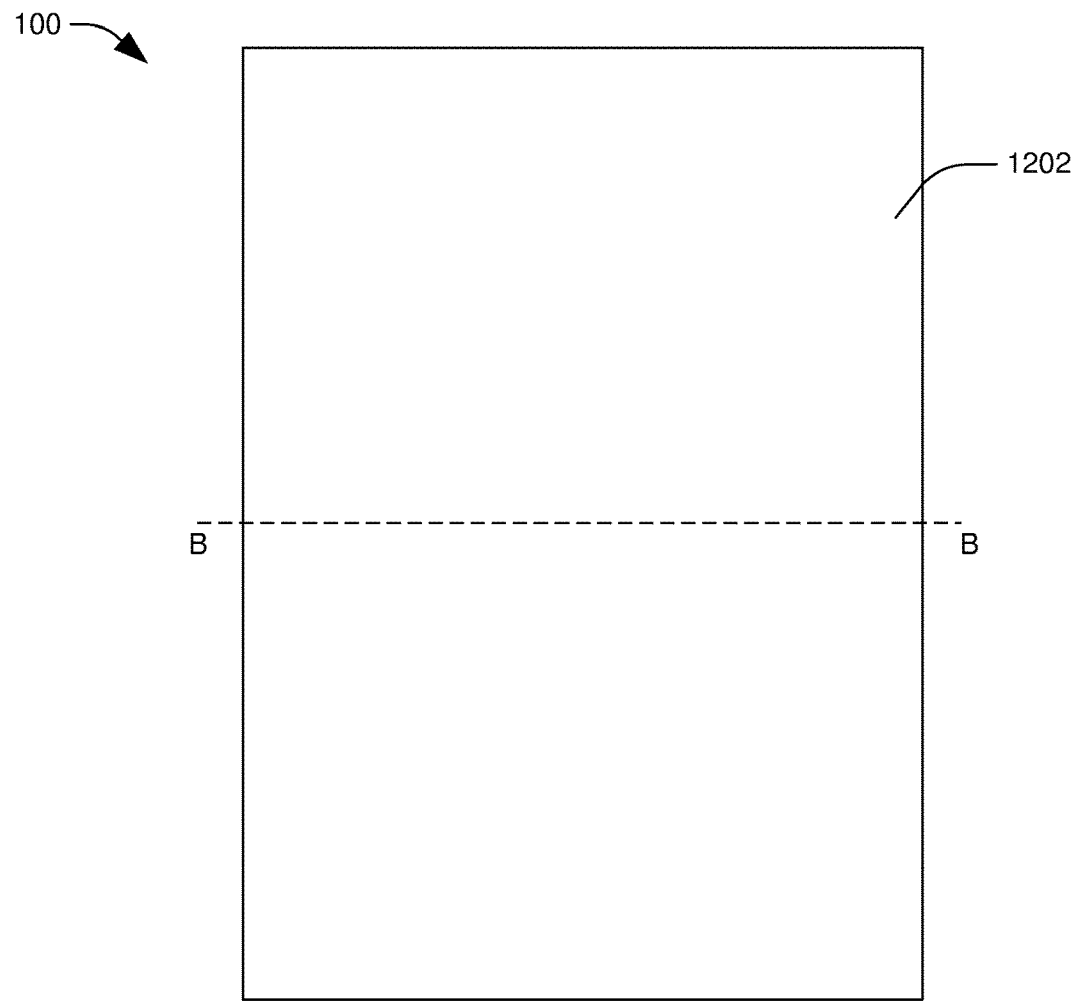
FIGS. 12A-12B illustrate a semiconductor device at a stage of fabrication, in accordance with some embodiments.
Figure 12B:
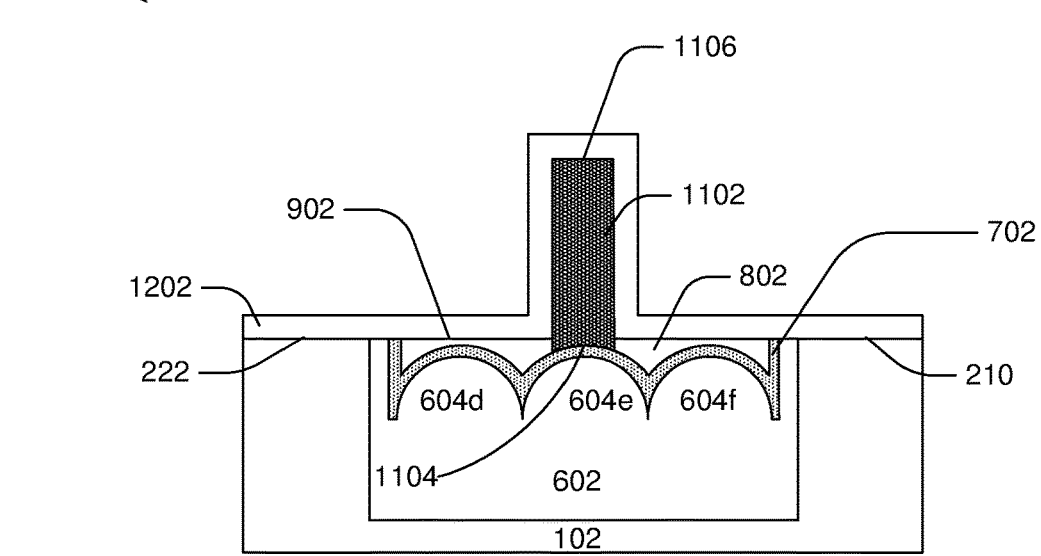

FIGS. 12A and 12B illustrate a second dielectric layer 1202 formed over at least one of the post 1102, the second layer 802, the first dielectric layer 102, the one or more damper layers 702 or the damper template 602, according to some embodiments. The second dielectric layer 1202 is formed by at least one of PVD, sputtering, CVD, PECVD, LPCVD, ALCVD, UHVCVD, RPCVD, ALD, MBE, LPE, spin on, growth, or other suitable techniques. The second dielectric layer 1202 is at least one of in direct contact or in indirect contact with the second end 1106 of the post 1102 and at least a portion of a lateral surface of the post 1102 between the first end 1104 and the second end 1106. The second dielectric layer 1202 at least one of overlies the second layer 802, is in direct contact with the top surface 902 of the second layer 802 or is in indirect contact with the top surface 902 of the second layer 802. The second dielectric layer 1202 at least one of overlies the first dielectric layer 102, is in direct contact with the top surface 222 and the top surface 210 of the first dielectric layer 102 or is in indirect contact with the top surface 222 and the top surface 210 of the first dielectric layer 102. The second dielectric layer 1202 comprises at least one of silicon, nitride such as SiN, oxide such as $SiO_2$, carbide such as SiC, or other suitable material. The second dielectric layer 1202 is different than the first dielectric layer 102, such as having a different material composition, such that an interface is defined between the second dielectric layer 1202 and the first dielectric layer 102. In some embodiments, the second dielectric layer 1202 does not have a material composition different than the first dielectric layer 102. An interface is nevertheless defined between the second dielectric layer 1202 and the first dielectric layer 102 because the second dielectric layer 1202 and the first dielectric layer 102 are separate, different, etc. from each other. In some embodiments, the first dielectric layer 102 and the second dielectric layer 1202 comprise SiN. Other structures and/or configurations of the second dielectric layer 1202 relative to other elements, features, etc. are within the scope of the present disclosure.

Figure 13A:
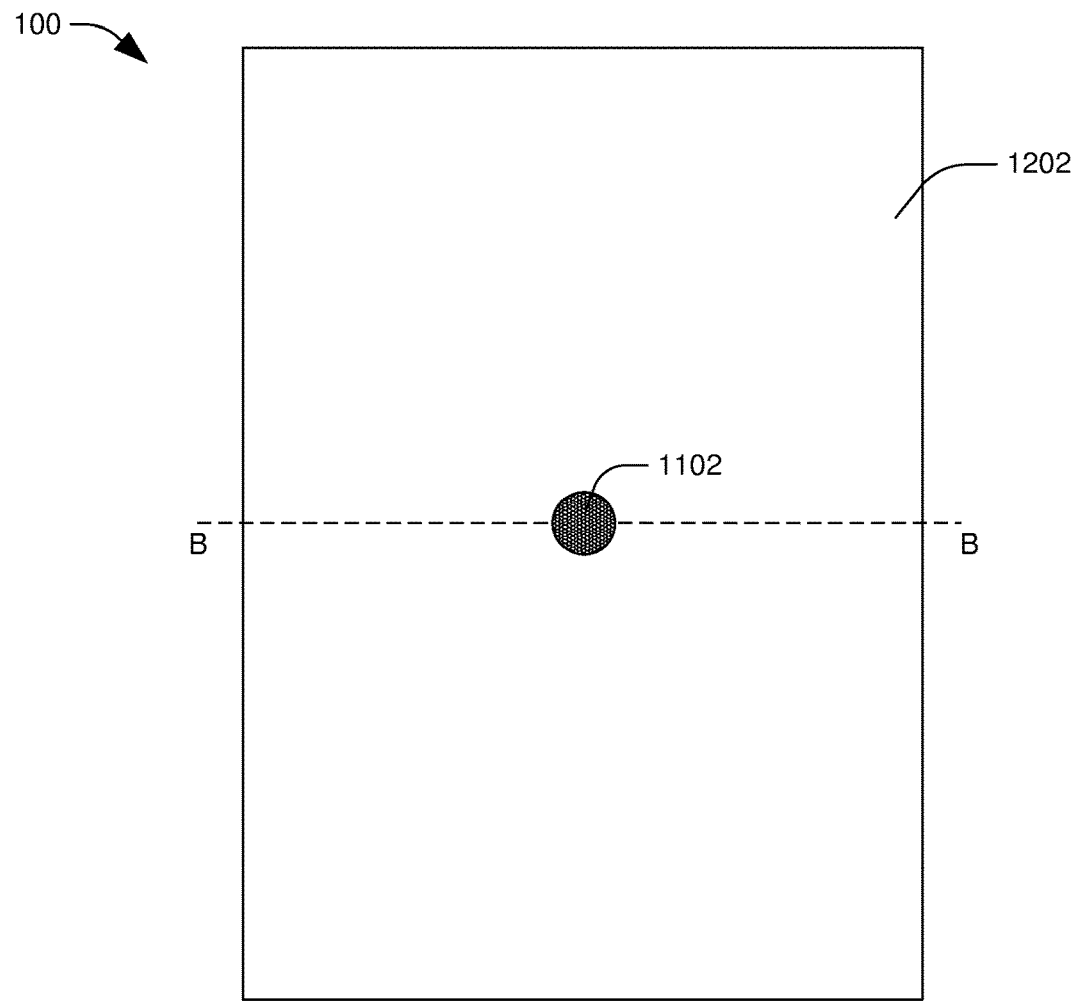
FIGS. 13A-13B illustrate a semiconductor device at a stage of fabrication, in accordance with some embodiments.
Figure 13B:
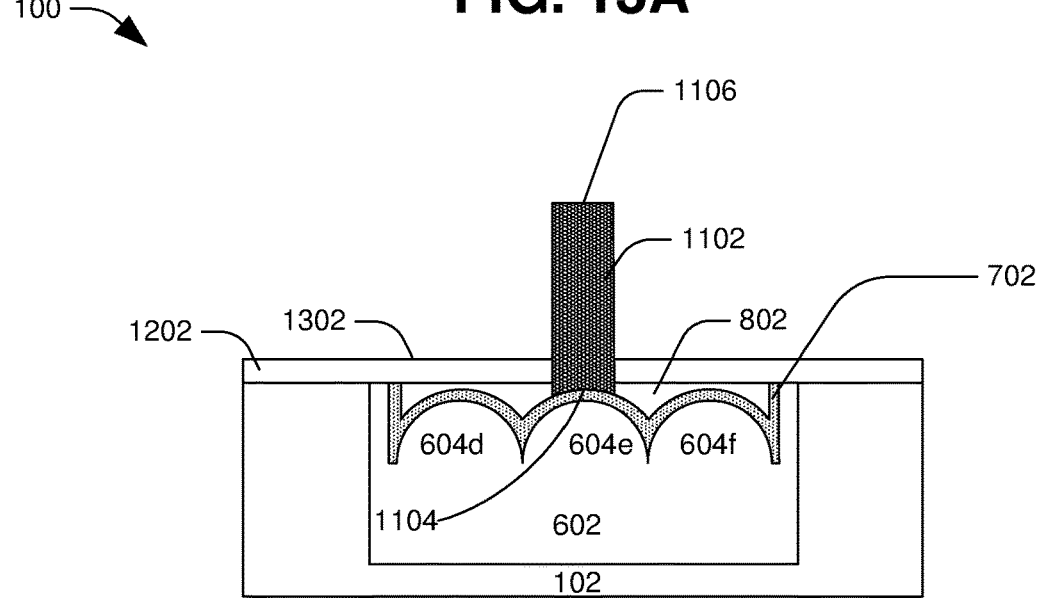

FIGS. 13A and 13B illustrate removal of a first portion of the second dielectric layer 1202, according to some embodiments. In some embodiments, the first portion of the second dielectric layer 1202 is removed by at least one of CMP, etching, or other suitable techniques. The first portion of the second dielectric layer 1202 comprises a portion of the second dielectric layer 1202 that is above a surface 1302 of the second dielectric layer 1202. In some embodiments, the first portion of the second dielectric layer 1202 comprises a portion of the second dielectric layer 1202 that is at least one of in direct contact with or in indirect contact with the second end 1106 of the post 1102 and a portion of the second dielectric layer 1202 that is at least one of in direct contact or in indirect contact with at least a portion of the lateral surface of the post 1102.

Figure 14A:
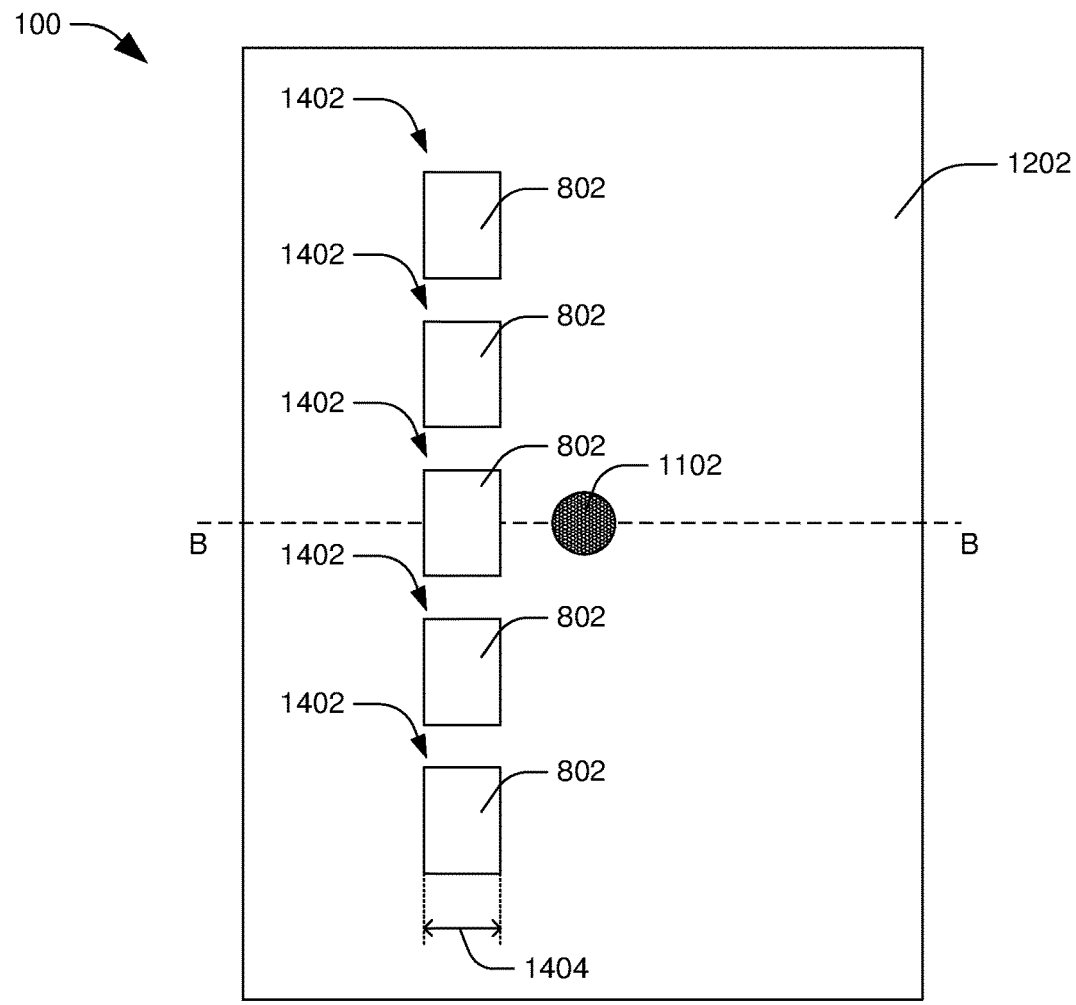
FIGS. 14A-14B illustrate a semiconductor device at a stage of fabrication, in accordance with some embodiments.
Figure 14B:
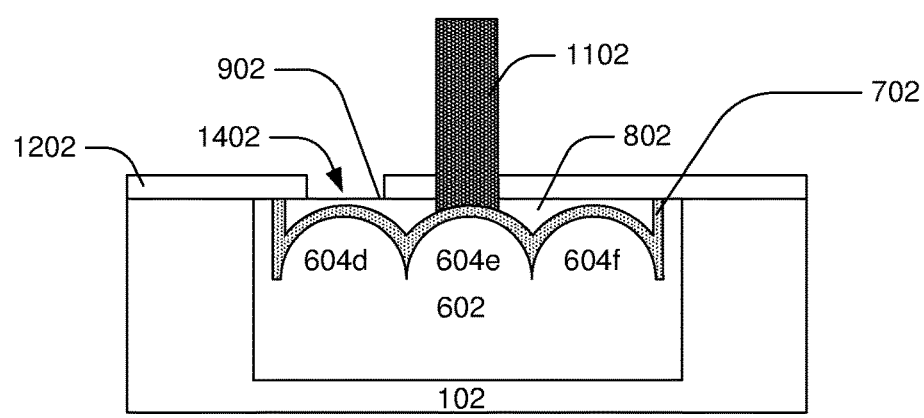

FIGS. 14A and 14B illustrate second openings 1402 formed in the second dielectric layer 1202, according to some embodiments. Portions of the second dielectric layer 1202 are removed to form the second openings 1402. The second openings 1402 expose portions of the second layer 802, such as portions of the top surface 902 of the second layer 802. In some embodiments, the second openings 1402 at least one of extend through at least some of the second layer 802 or expose portions of the one or more damper layers 702. A width 1404 (depicted in FIG. 14A) of a second opening 1402 is at least about 2,000 angstroms. Other values of the width 1404 are within the scope of the present disclosure. According to some embodiments, the second openings 1402 are formed using a photoresist (not shown). The photoresist is formed over at least one of the second dielectric layer 1202 or the post 1102 by at least one of PVD, sputtering, CVD, PECVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist.

In some embodiments, an etching process is performed to remove portions of the second dielectric layer 1202 to form the second openings 1402, where openings in the photoresist allow one or more etchants applied during the etching process to remove the portions of the second dielectric layer 1202 to form the second openings 1402 while the photoresist protects or shields portions of at least one of the second dielectric layer 1202 or the post 1102 that are covered by the photoresist. The etching process is at least one of a dry etching process, a wet etching process, an anisotropic etching process, an isotropic etching process or other suitable etching process. The etching process uses at least one of fluorine, HF, diluted HF, $SF_6$, a chlorine compound such as $HCl_2$, $H_2S$, $CF_4$, or other suitable material. The photoresist is stripped or washed away after the second openings 1402 are formed. Other processes and/or techniques for forming the second openings 1402 are within the scope of the present disclosure.

Figure 15A:
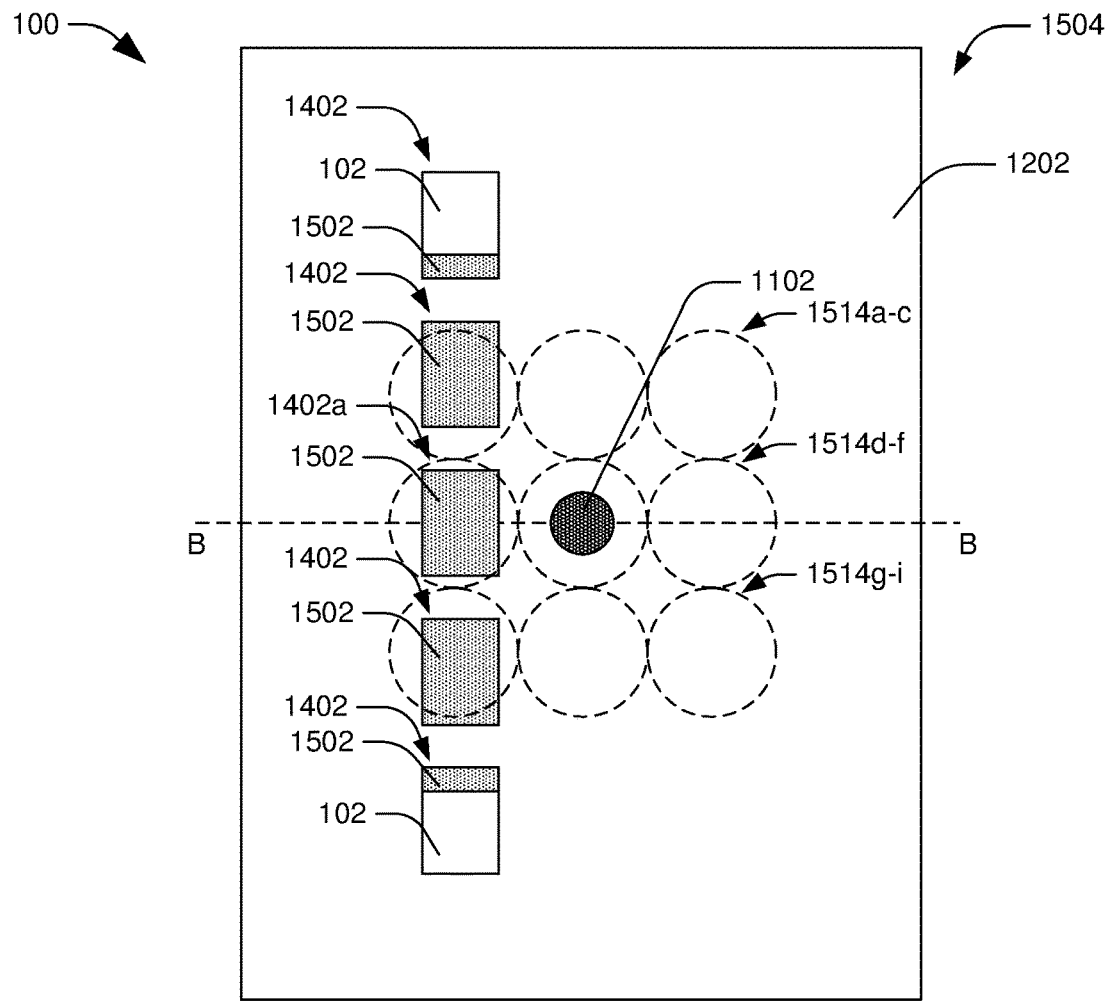
FIGS. 15A-15B illustrate a semiconductor device at a stage of fabrication, in accordance with some embodiments.
Figure 15A:
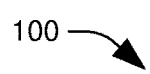
Figure 15B:
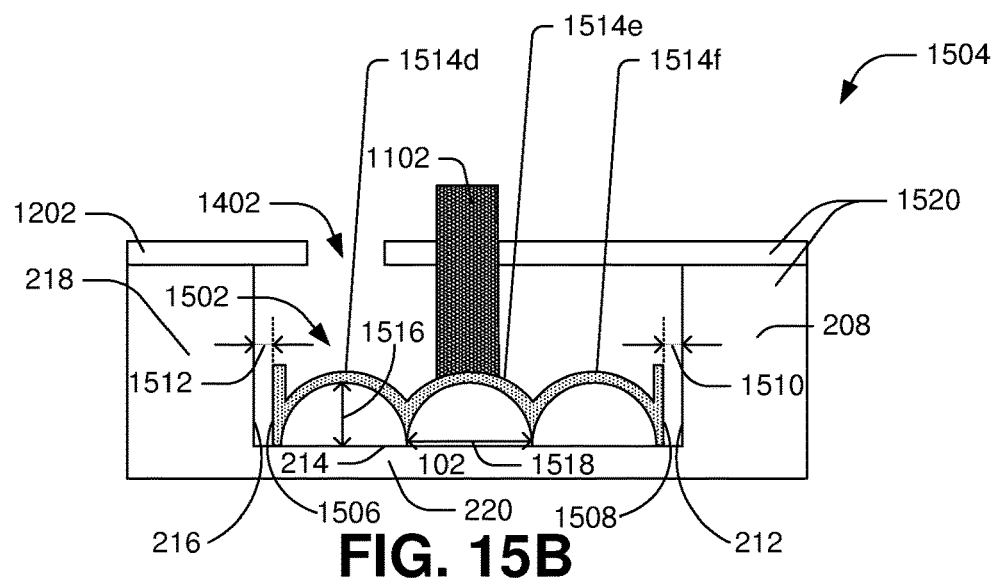

FIGS. 15A and 15B illustrate removal of at least one of the damper template 602 or the second layer 802 to establish a damper 1502 from the one or more damper layers 702, according to some embodiments. In some embodiments, at least one of the damper template 602 or the second layer 802 is removed by etching at least one of the damper template 602 or the second layer 802 through at least some of the second openings 1402. An etching process performed to remove at least one of the damper template 602 or the second layer 802 comprises introducing one or more etchants, through at least some of the second openings 1402, to at least one of the damper template 602 or the second layer 802. The one or more etchants have a selectivity such that the one or more etchants remove or etch away at least one of the damper template 602 or the second layer 802 at a greater rate than the one or more etchants remove or etch away at least one of the one or more damper layers 702, the post 1102, the second dielectric layer 1202 or the first dielectric layer 102. Etching byproducts of the etching process, such as a gas produced when the one or more etchants interact with at least one of the damper template 602 or the second layer 802, are exhausted to outside of the semiconductor device 100 through at least some of the second openings 1402. In some embodiments, the etching byproducts are pumped to the outside of the semiconductor device 100 using a vacuum. The one or more etchants comprise at least one of fluorine, HF, diluted HF, $SF_6$ such as $SF_6$ gas, a chlorine compound such as $HCl_2$, $H_2S$, $CF_4$, or other suitable material. In some embodiments, as a result of removing the damper template 602, the damper 1502 is displaced and/or drops toward the third portion 220 of the first dielectric layer 102. The damper 1502 is at least one of in direct contact or in indirect contact with the top surface 214 of the third portion 220 of the first dielectric layer 102. Other processes and/or techniques for removing at least one of the damper template 602 or the second layer 802 and/or establishing the damper 1502 are within the scope of the present disclosure.

The semiconductor device 100 comprises a damping device 1504. The damping device 1504 is a micro-damping device or other type of damping device. The damping device 1504 comprises the post 1102 and the damper 1502. The first dielectric layer 102 and the second dielectric layer 1202 form a case 1520, of the damping device 1504, in which at least one of the damper 1502 or a portion of the post 1102 is disposed. In some embodiments, the case 1520 at least partially encloses the damper 1502. A distance 1512 between the first sidewall 216 of the first portion 218 of the first dielectric layer 102 and a third sidewall 1506 of the damper 1502 is at least about 50 angstroms. A distance 1510 between the second sidewall 212 of the second portion 208 of the first dielectric layer 102 and a fourth sidewall 1508 of the damper 1502 is at least about 50 angstroms. Other values of the distance 1512 and the distance 1510 are within the scope of the present disclosure.

The damper 1502 comprises one or more mechanical deflectors 1514. A mechanical deflector of the one or more mechanical deflectors 1514 has a hemispherical shape, an inverse U-shape, or other suitable shape. Dashed-line circles in FIG. 15A show outer circumferences of the one or more mechanical deflectors 1514 according to some embodiments. At least a portion of at least some of the one or more mechanical deflectors 1514 at least one of underlie or are covered by the second dielectric layer 1202. At least a portion of at least some of the one or more mechanical deflectors 1514 underlie or are exposed by one or more openings of the second openings 1402. Other structures and/or configurations of the one or more mechanical deflectors 1514 relative to other elements, features, etc. are within the scope of the present disclosure.

Even though nine mechanical deflectors 1514 are depicted, any number of mechanical deflectors 1514 are contemplated, according to some embodiments. In some embodiments, the one or more mechanical deflectors 1514 are arranged across one or more rows comprising at least one of a first row 1514*a-c* of mechanical deflectors, a second row 1514*d-f* of mechanical deflectors or a third row 1514*g-i* of mechanical deflectors (depicted in FIG. 15A). In some embodiments, the first row 1514*a-c* of mechanical deflectors comprises at least one of a mechanical deflector 1514*a*, a mechanical deflector 1514*b*, or a mechanical deflector 1514*c*, the second row 1514*d-f* of mechanical deflectors comprises at least one of a mechanical deflector 1514*d*, a mechanical deflector 1514*e*, or a mechanical deflector 1514*f*, and the third row 1514*g-i* of mechanical deflectors comprises at least one of a mechanical deflector 1514*g*, a mechanical deflector 1514*h*, or a mechanical deflector 1514*i*. Even though three mechanical deflectors 1514 per row are depicted, any number of mechanical deflectors 1514 per row are contemplated, according to some embodiments. Embodiments are contemplated in which a number of mechanical deflectors 1514 of a first row differs from a number of mechanical deflectors 1514 of a second row. Even though three rows of mechanical deflectors 1514 are depicted, any number of rows of mechanical deflectors 1514 are contemplated, according to some embodiments.

The mechanical deflector 1514*e*, to which the post 1102 is coupled, is between a mechanical deflector 1514*d* and a mechanical deflector 1514*f* such that the mechanical deflector 1514*e* is laterally offset from the mechanical deflector 1514*d* and the mechanical deflector 1514*f*. In one embodiment, the damping device 1504 comprises the second row 1514*d-f* of mechanical deflectors comprising merely three mechanical deflectors 1514*d*, 1514*e*, and 1514*f*, and the damping device 1504 does not comprise other rows of mechanical deflectors other than the second row 1514*d-f* of mechanical deflectors.

A distance 1516 (depicted in FIG. 15B) between the top surface 214 of the third portion 220 of the first dielectric layer 102 and an opposing bottom surface of a top portion of a mechanical deflector 1514 is at least about 1,000 angstroms, such as at least about 2,000 angstroms. A width 1518 of a lower portion of a mechanical deflector 1514, such as a portion of the mechanical deflector 1514 that is in contact with the top surface 214 of the third portion 220 of the first dielectric layer 102, is at least about 1,000 angstroms, such as at least about 3,000 angstroms. The distance 1516 is larger than or smaller than the width 1518. Other values of the distance 1516 and the width 1518 are within the scope of the present disclosure.

Even though one post 1102 of the damping device 1504 is depicted, any number of posts 1102 coupled to any number of mechanical deflectors 1514 of the damping device 1504 are contemplated, according to some embodiments.

FIG. 16 illustrates a cross-sectional view of the second end 1106 of the post 1102 coupled to a chip holder 1602, according to some embodiments. In some embodiments, the second end 1106 of the post 1102 is bonded with the chip holder 1602, such as by at least one of one or more bonding layers, an adhesive, a bonding process, or other suitable techniques. In some embodiments where the second end 1106 of the post 1102 is bonded with the chip holder 1602 using the one or more bonding layers, the one or more bonding layers are between the second end 1106 of the post 1102 and the chip holder 1602. In some embodiments, the second end 1106 of the post 1102 is at least one of coupled to or bonded with a contact structure 1604 of the chip holder 1602, such as at least one of a metal contact structure or other suitable structure.

FIG. 17 illustrates a top view of a chip 1702 coupled to the chip holder 1602. The chip holder 1602 is configured to support the chip 1702. In some embodiments, the chip 1702 is bonded with the chip holder 1602, such as by at least one of one or more bonding layers, an adhesive, a bonding process, or other suitable techniques. The chip 1702 is a microchip or other type of chip. In some embodiments, the chip 1702 comprises a sensor chip, such as at least one of an image sensor chip, a CIS chip, a backside CIS chip, a proximity sensor chip, a ToF sensor chip, an iToF sensor chip, a BSI sensor chip, or other type of sensor chip. In some embodiments, the sensor chip is part of a camera, such as at least one of a standalone camera, a phone camera, etc., wherein the camera comprises a lens to which the sensor chip is coupled. In some embodiments, the chip 1702 comprises a logic circuit chip, a LED circuit chip, a LCD circuit chip, a RAM circuit chip, or other type of chip. Other structures and/or configurations of the chip 1702 are within the scope of the present disclosure.

The chip holder 1602 is coupled to a plurality of posts 1102. Even though eight posts of the plurality of posts 1102 are depicted, any number of posts 1102 are contemplated, according to some embodiments. Dashed-line circles in FIG. 17 show circumferences of the plurality of posts 1102 according to some embodiments. The plurality of posts 1102 underlie or are covered by the chip holder 1602. In some embodiments, the plurality of posts 1102 are coupled to a plurality of mechanical deflectors 1514 (not shown in FIG. 17). In some embodiments, each post of the plurality of posts 1102 is part of a unique and/or separate damping device 1504. In some embodiments, multiple posts of the plurality of posts 1102 are part of a single damping device 1504, such as where the multiple posts comprise at least one of a first post coupled to a first mechanical deflector of the single damping device 1504, a second post coupled to a second mechanical deflector of the single damping device 1504, etc. The chip 1702 is between first posts 1102a-d of the plurality of posts 1102 and second posts 1102e-h of the plurality of posts 1102, such that the chip 1702 is laterally offset from the first posts 1102a-d and the second posts 1102e-h. Other structures and/or configurations of the plurality of posts 1102, the chip holder 1602 and/or the chip 1702 relative to other elements, features, etc. are within the scope of the present disclosure.

In some embodiments, one or more damping devices 1504 of the semiconductor device 100 reduce stress on at least one of the chip holder 1602 or the chip 1702 and at least one of inhibit or prevent damage to the semiconductor device 100 and/or the chip 1702 and improve performance of the semiconductor device 100 and/or the chip 1702. The damping device 1504 damps and/or absorbs at least one of vibrations, movements, shock impulses, etc. to which the semiconductor device 100 is subjected, thereby at least one of inhibiting or preventing damage to the semiconductor device 100 and/or the chip 1702 that would be caused by the vibrations, the movements, the shock impulses, etc. if the semiconductor device 100 did not comprise the damping device 1504. In some embodiments, the damping device 1504 at least one of inhibits or prevents an adverse effect on performance of the semiconductor device 100 and/or the chip 1702 that would be caused by the vibrations, the movements, the shock impulses, etc. if the semiconductor device 100 did not comprise the damping device 1504.

In some embodiments, force may be applied to one or more posts 1102 as a result of at least one of vibrations, movements, shock impulses, etc. to which the semiconductor device 100 is subjected. In some embodiments, the force is transferred through the one or more posts 1102 and, by way of deflection, deformation, etc. of one or more dampers 1502 of the one or more damping devices 1504, the force is damped and/or absorbed by one or more damping devices 1504 coupled to the one or more posts 1102. In some embodiments, the force is transferred through a post 1102 to one or more mechanical deflectors 1514 causing the one or more mechanical deflectors 1514 to at least one of deflect, deform, etc. to damp and/or absorb the force. Implementing the semiconductor device 100 with the one or more damping devices 1504 thereby at least one of improves the mechanical stability of the chip 1702, improves the mechanical stability of the chip holder 1602, improves the mechanical stability of the semiconductor device 100, improves the mechanical stability of microchip packaging containing the chip 1702, improves performance of the semiconductor device 100, or improves performance of the chip 1702.

Figure 18:
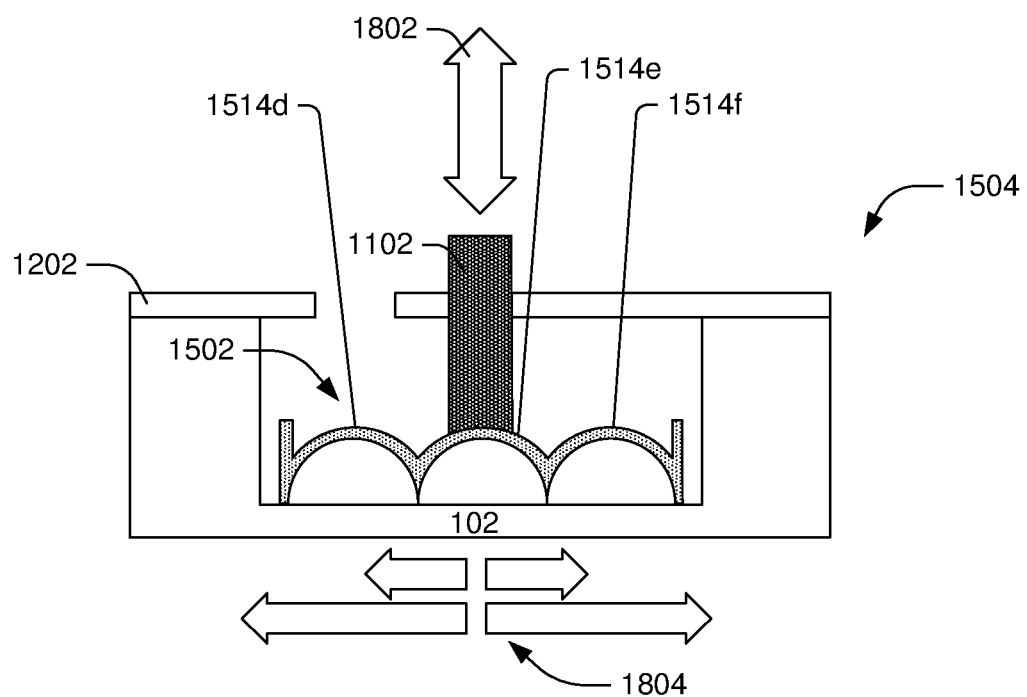
FIG. 18 illustrates a damping device, in accordance with some embodiments.

FIG. 18 illustrates a cross-sectional view of a damping device 1504, according to some embodiments. FIG. 18 illustrates force 1802 applied to a post 1102 of the damping device 1504. The force 1802 is caused by at least one of a vibration of the damping device 1504 and/or a device comprising the damping device 1504, movement of the damping device 1504 and/or the device comprising the damping device 1504, a shock impulse to the damping device 1504 and/or the device comprising the damping device 1504, shaking of the damping device 1504 and/or the device comprising the damping device 1504, etc. The force 1802 is damped and/or absorbed by way of deformation of the damper 1502 and deflection 1804 of the force 1802 by the damper 1502. In some embodiments, the force 1802 transfers through the post 1102 and causes the mechanical deflector 1514e coupled to the post 1102 to deform, thereby deflecting, damping and/or absorbing the force 1802. In some embodiments, one or more mechanical deflectors adjacent the mechanical deflector 1514e, such as the mechanical deflector 1514d and the mechanical deflector 1514e, assist in deflecting, damping and/or absorbing the force 1802. In some embodiments, deformation of the mechanical deflector 1514e causes the mechanical deflector 1514d and the mechanical deflector 1514e to deform, wherein the deformation of the one or more adjacent mechanical deflectors further damps and/or absorb the force 1802.

FIGS. 19A-19D illustrate top views of various embodiments of a damping device 1504 with different arrangements of posts 1102 and mechanical deflectors 1514.

Figure 19A:
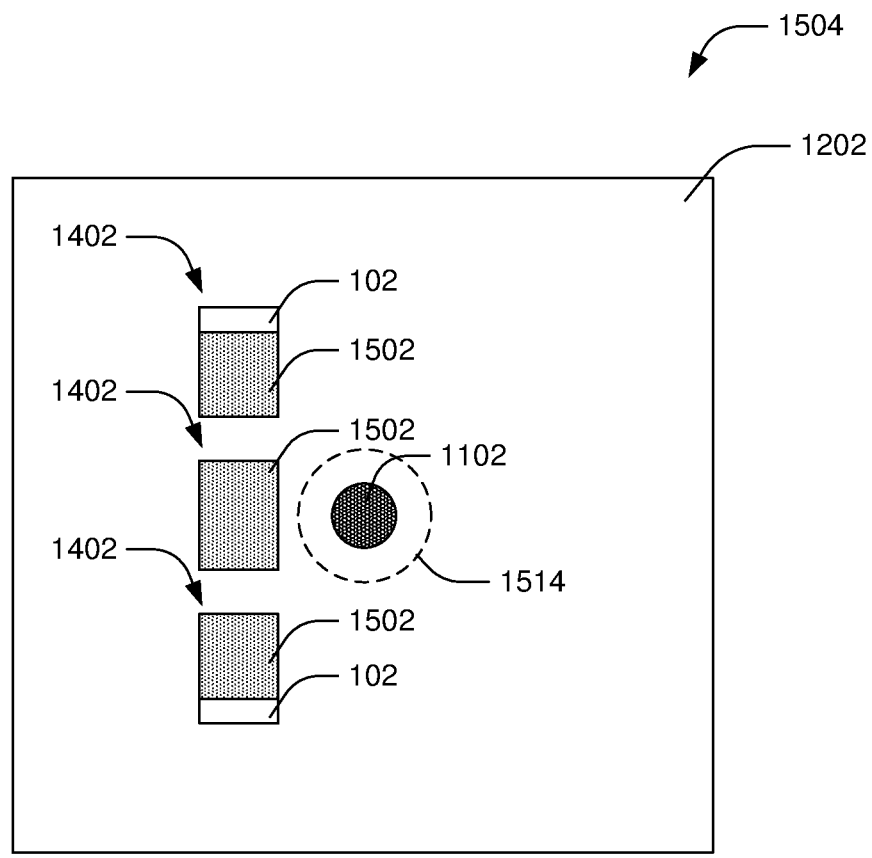
FIG. 19A-19D illustrate damping devices, in accordance with some embodiments.

FIG. 19A illustrates the damping device 1504 with a single post 1102 and a single mechanical deflector 1514, according to some embodiments. A first end of the single post 1102 is coupled to the single mechanical deflector 1514 and a second end of the single post 1102 is configured to be coupled to a chip holder, such as the chip holder 1602.

Figure 19B:
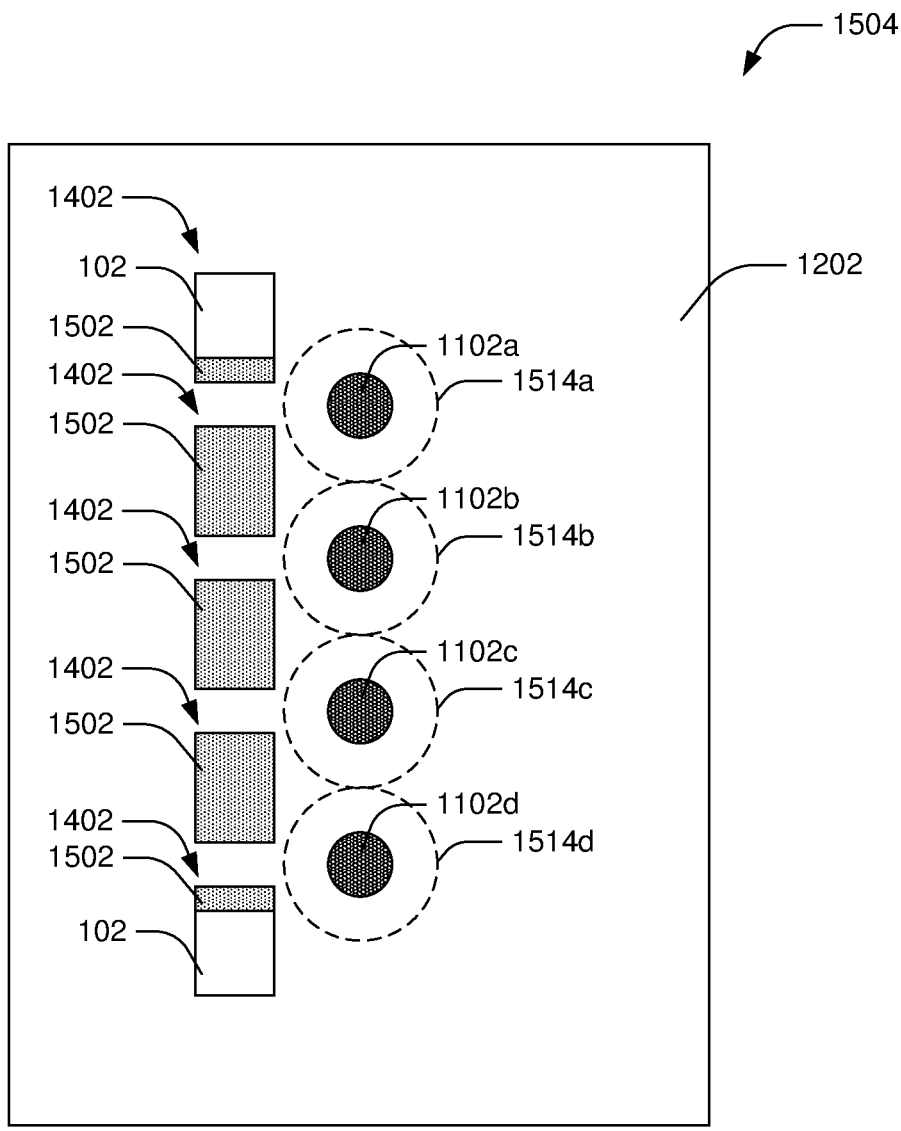

FIG. 19B illustrates the damping device 1504 with multiple posts 1102a, 1102b, 1102c and 1102d, and multiple mechanical deflectors 1514a, 1514b, 1514c and 1514d, according to some embodiments. First ends of the multiple posts are coupled to the multiple mechanical deflectors, respectively. Second ends of the multiple posts are configured to be coupled to a chip holder, such as the chip holder 1602. The multiple posts and the multiple mechanical deflectors are arranged in a column.

Figure 19C:
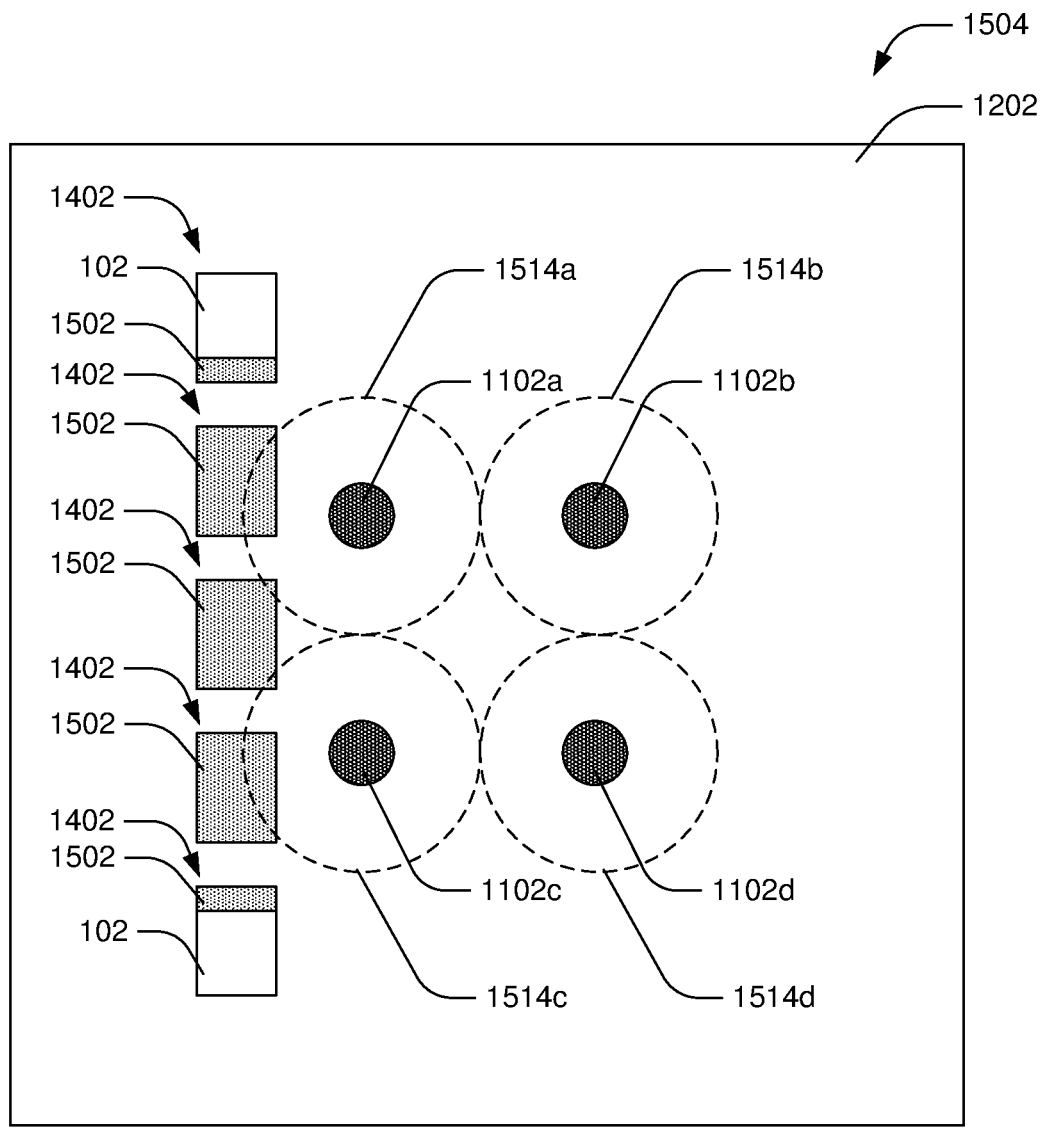

FIG. 19C illustrates the damping device 1504 with multiple posts 1102a, 1102b, 1102c and 1102d, and multiple mechanical deflectors 1514a, 1514b, 1514c and 1514d, according to some embodiments. First ends of the multiple posts are coupled to the multiple mechanical deflectors, respectively. Second ends of the multiple posts are configured to be coupled to a chip holder, such as the chip holder 1602. The multiple posts and the multiple mechanical deflectors are arranged across two rows.

Figure 19D:
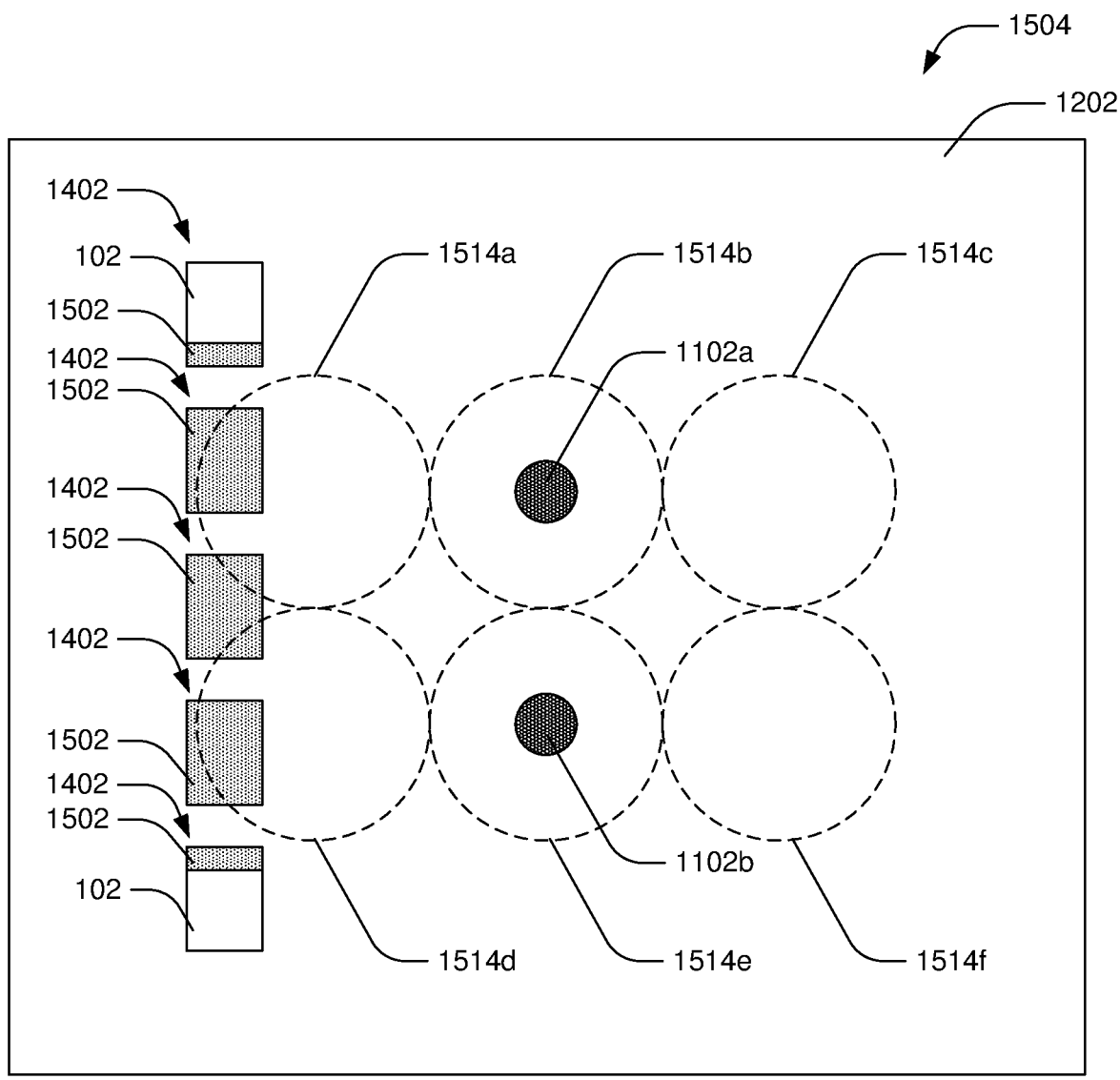

FIG. 19D illustrates the damping device 1504 with multiple posts 1102a and 1102b, and multiple mechanical deflectors 1514a, 1514b, 1514c, 1514d, 1514e and 1514f, according to some embodiments. A first end of a post 1102a is coupled to a mechanical deflector 1514b and a second end of the post 1102a is configured to be coupled to a chip holder, such as the chip holder 1602. A first end of a post 1102b is coupled to a mechanical deflector 1514e and a second end of the post 1102b is configured to be coupled to the chip holder. The multiple mechanical deflectors are arranged across two rows. The mechanical deflector 1514b, to which the post 1102a is coupled, is between a mechanical deflector 1514a and a mechanical deflector 1514c such that the mechanical deflector 1514b is laterally offset from the mechanical deflector 1514a and the mechanical deflector 1514c. The mechanical deflector 1514e, to which the post 1102b is coupled, is between a mechanical deflector 1514d and a mechanical deflector 1514f such that the mechanical deflector 1514e is laterally offset from the mechanical deflector 1514d and the mechanical deflector 1514f.

Other structures and/or configurations of the damping device 1504 other than those shown in FIGS. 1A-19D are within the scope of the present disclosure.

In some embodiments, a semiconductor device is provided. The semiconductor device includes a chip holder to support a chip. The semiconductor device includes a damping device. The damping device includes a damper and a post. A first end of the post is coupled to the damper and a second end of the post is coupled to the chip holder.

In some embodiments, the damping device includes a case in which the damper is disposed.

In some embodiments, the case includes silicon nitride.

In some embodiments, the damper includes a mechanical deflector to which the first end of the post is coupled.

In some embodiments, the damper includes a second mechanical deflector laterally offset from the mechanical deflector, and a third mechanical deflector laterally offset from the mechanical deflector. The mechanical deflector is between the second mechanical deflector and the third mechanical deflector.

In some embodiments, the chip includes an image sensor.

In some embodiments, the damper includes a first damper layer, a second damper layer over the first damper layer, and a third damper layer over the second damper layer.

In some embodiments, the first damper layer includes a first metal, the second damper layer includes a non-metal, and the third damper layer includes a second metal.

In some embodiments, a thickness of the third damper layer is greater than a thickness of the first damper layer.

In some embodiments, a damping device is provided. The damping device includes a damper including a mechanical deflector, a post coupled to the mechanical deflector, and a case in which the damper is disposed.

In some embodiments, the case includes silicon nitride.

In some embodiments, a shape of the mechanical deflector is hemispherical.

In some embodiments, the damper includes a first damper layer, a second damper layer over the first damper layer, and a third damper layer over the second damper layer.

In some embodiments, the first damper layer includes a first metal, the second damper layer includes a non-metal, and the third damper layer includes a second metal.

In some embodiments, a method for forming a damping device is provided. The method includes forming a recess in a first dielectric layer. The method includes forming, in the recess, a damper template. The method includes forming a metal layer over the damper template. The method includes removing the damper template to establish a damper from the metal layer.

In some embodiments, the method includes forming a layer over the metal layer. The method includes forming an opening in the layer, wherein the opening exposes a portion of the metal layer. The method includes forming a post through the opening to the portion of the metal layer.

In some embodiments, the method includes removing the layer after forming the post.

In some embodiments, the method includes forming a second dielectric layer over the first dielectric layer and the layer. The method includes forming a second opening in the second dielectric layer, wherein removing the damper template includes etching the damper template through the second opening and/or wherein removing the layer includes etching the layer through the second opening.

In some embodiments, the method includes forming a non-metal layer over the metal layer. The method includes forming a second metal layer over the non-metal layer, wherein the damper is established from the metal layer, the non-metal layer, and the second metal layer. The method includes forming a post overlying the second metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
a chip holder to support a chip; and
a damping device, comprising:
a damper;
a post, wherein a first end of the post is coupled to the damper and a second end of the post is coupled to the chip holder; and
a case, wherein:
the case defines a void in which the damper is disposed,
an opening is defined in a top surface of the case facing the second end of the post, and
the opening is separated from the post by a portion of the top surface of the case.

2. The semiconductor device of claim 1, wherein:
the case comprises a dielectric layer, and the opening is defined in the dielectric layer.

3. The semiconductor device of claim 1, wherein:
the case comprises silicon nitride.

4. The semiconductor device of claim 1, wherein:
the damper comprises a mechanical deflector to which the first end of the post is coupled.

5. The semiconductor device of claim 4, wherein the damper comprises:
a second mechanical deflector laterally offset from the mechanical deflector; and
a third mechanical deflector laterally offset from the mechanical deflector, wherein the mechanical deflector is between the second mechanical deflector and the third mechanical deflector.

6. The semiconductor device of claim 1, wherein:
the chip comprises an image sensor.

7. The semiconductor device of claim 1, wherein the damper comprises:
a first damper layer;
a second damper layer over the first damper layer; and
a third damper layer over the second damper layer.

8. The semiconductor device of claim 7, wherein:
the first damper layer comprises a first metal;
the second damper layer comprises a non-metal; and
the third damper layer comprises a second metal.

9. The semiconductor device of claim 7, wherein:
a thickness of the third damper layer is greater than a thickness of the first damper layer.

10. A damping device, comprising:
a damper comprising a mechanical deflector;
a post coupled to the mechanical deflector; and
a case, wherein:
the case defines a void in which the damper is disposed,
the case comprises a first layer defining a top of the void,
the first layer defines an opening, and
the opening is separated from the post by a portion of the first layer.

11. The damping device of claim 10, wherein:
the case comprises silicon nitride.

12. The damping device of claim 10, wherein:
a shape of the mechanical deflector is hemispherical.

13. The damping device of claim 10, wherein the damper comprises:
a second mechanical deflector laterally offset from the mechanical deflector; and
a third mechanical deflector laterally offset from the mechanical deflector.

14. The damping device of claim 10, wherein the damper comprises:
a first damper layer;
a second damper layer over the first damper layer; and
a third damper layer over the second damper layer.

15. The damping device of claim 14, wherein:
the first damper layer comprises a first metal;
the second damper layer comprises a non-metal; and
the third damper layer comprises a second metal.

16. A semiconductor device, comprising:
a damper;
a post, wherein a first end of the post is coupled to the damper; and
a case in which the damper is disposed, wherein:
the case comprises a first dielectric layer defining a top of a void in which the damper is disposed,
the first dielectric layer defines an opening, and
the opening is separated from the post by a first portion of first dielectric layer.

17. The semiconductor device of claim 16, wherein:
the damper comprises:
a first damper layer;
a second damper layer over the first damper layer; and
a third damper layer over the second damper layer, and
the first damper layer, the second damper layer, and the third damper layer have non-planar top surfaces.

18. The semiconductor device of claim 17, wherein:
the first damper layer comprises a first metal;
the second damper layer comprises a non-metal; and
the third damper layer comprises a second metal.

19. The semiconductor device of claim 16, wherein the case comprises a second dielectric layer below the first dielectric layer and defining sidewalls and a bottom of the void.

20. The semiconductor device of claim 16, comprising:
a chip holder to support a chip, wherein a second end of the post is coupled to the chip holder.

* * * * *